(12) United States Patent
Lu et al.

(10) Patent No.: US 11,955,370 B2
(45) Date of Patent: Apr. 9, 2024

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Bo-Cyuan Lu, New Taipei (TW); Ting-Gang Chen, Taipei (TW); Sung-En Lin, Hsinchu County (TW); Chunyao Wang, Zhubei (TW); Yung-Cheng Lu, Hsinchu (TW); Chi On Chui, Hsinchu (TW); Tai-Chun Huang, Hsinchu (TW); Chieh-Ping Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 279 days.

(21) Appl. No.: 17/025,528

(22) Filed: Sep. 18, 2020

(65) Prior Publication Data

US 2021/0335657 A1 Oct. 28, 2021

Related U.S. Application Data

(60) Provisional application No. 63/016,488, filed on Apr. 28, 2020.

(51) Int. Cl.
*H01L 21/762* (2006.01)
*H01L 21/02* (2006.01)
(Continued)

(52) U.S. Cl.
CPC .... *H01L 21/76224* (2013.01); *H01L 21/0217* (2013.01); *H01L 21/02211* (2013.01); *H01L 21/02274* (2013.01); *H01L 21/0228* (2013.01); *H01L 21/31116* (2013.01); *H01L 21/76837* (2013.01); *H01L 21/823481* (2013.01)

(58) Field of Classification Search
CPC ............ H01L 21/0217; H01L 21/0228; H01L 21/02211; H01L 21/02205; H01L 21/823481; H01L 21/02274; H01L 21/76224; H01L 21/76837; C23C 16/56; C23C 16/045
See application file for complete search history.

(56) References Cited

U.S. PATENT DOCUMENTS 8,962,400 B2 2/2015 Tsai et al.
9,093,514 B2 7/2015 Tsai et al.
(Continued)

*Primary Examiner* — Michael M Trinh
(74) *Attorney, Agent, or Firm* — Slater Matsil, LLP

(57) ABSTRACT

A system and methods of forming a dielectric material within a trench are described herein. In an embodiment of the method, the method includes introducing a first precursor into a trench of a dielectric layer, such that portions of the first precursor react with the dielectric layer and attach on sidewalls of the trench. The method further includes partially etching portions of the first precursor on the sidewalls of the trench to expose upper portions of the sidewalls of the trench. The method further includes introducing a second precursor into the trench, such that portions of the second precursor react with the remaining portions of the first precursor to form the dielectric material at the bottom of the trench.

20 Claims, 30 Drawing Sheets

(51) Int. Cl.
*H01L 21/311* (2006.01)
*H01L 21/768* (2006.01)
H01L 21/8234 (2006.01)

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 9,865,456 B1 * | 1/2018 | Pandey | H01L 21/0234 |
| 10,354,918 B2 * | 7/2019 | Liang | H01L 21/76831 |
| 2013/0164942 A1 * | 6/2013 | Kato | H01L 21/30 438/758 |
| 2013/0260555 A1 * | 10/2013 | Zope | H01L 21/76879 438/660 |
| 2018/0061628 A1 * | 3/2018 | Ou | H01L 21/32 |
| 2018/0350668 A1 | 12/2018 | Cheng et al. | |
| 2019/0172723 A1 * | 6/2019 | Cheng | H01L 21/02592 |
| 2019/0311947 A1 * | 10/2019 | Tapily | H01L 21/76877 |
| 2021/0249264 A1 * | 8/2021 | Kato | H01L 21/02639 |
| 2022/0139696 A1 * | 5/2022 | Nakatani | C23C 16/45534 438/761 |

* cited by examiner

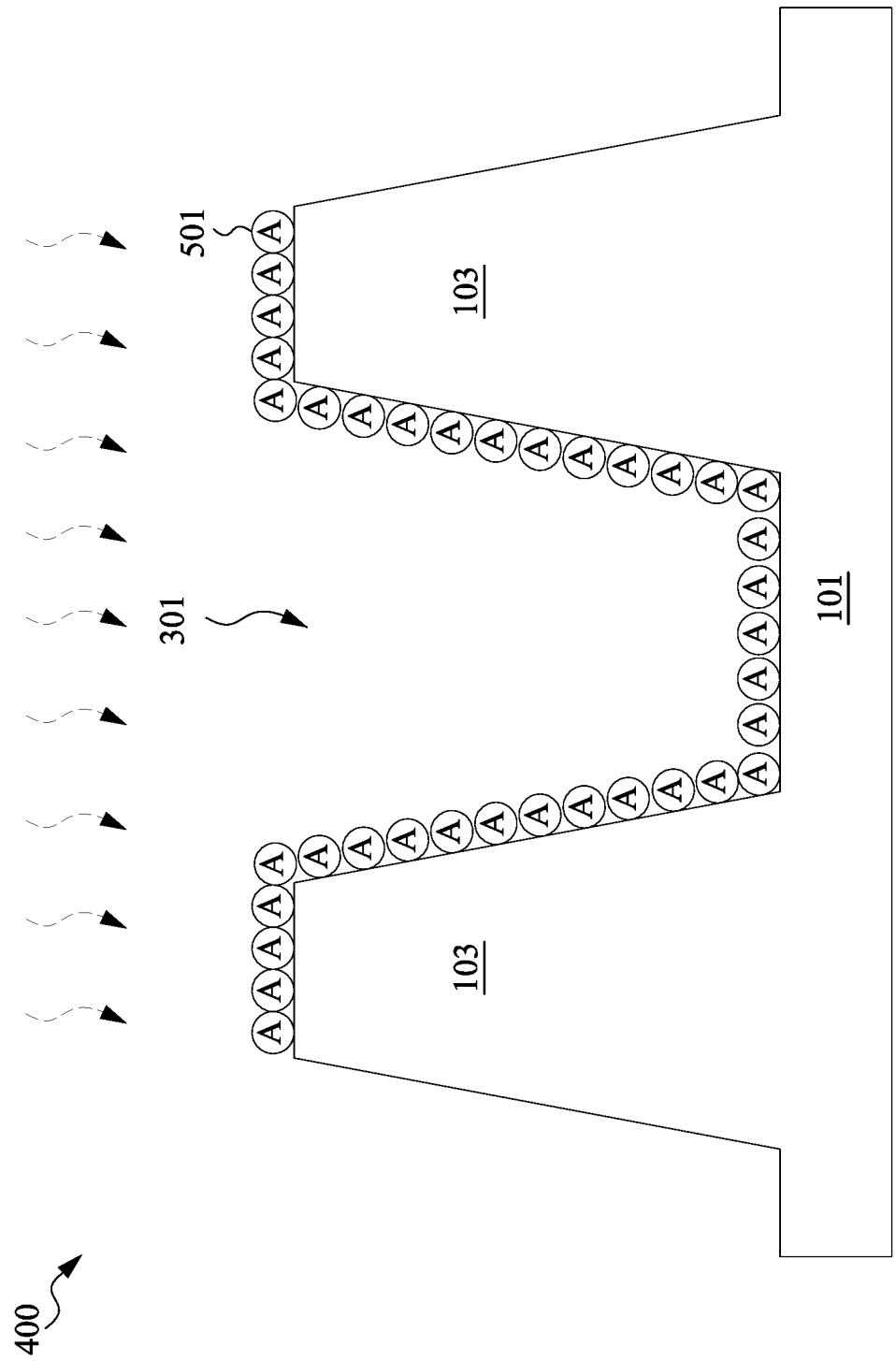

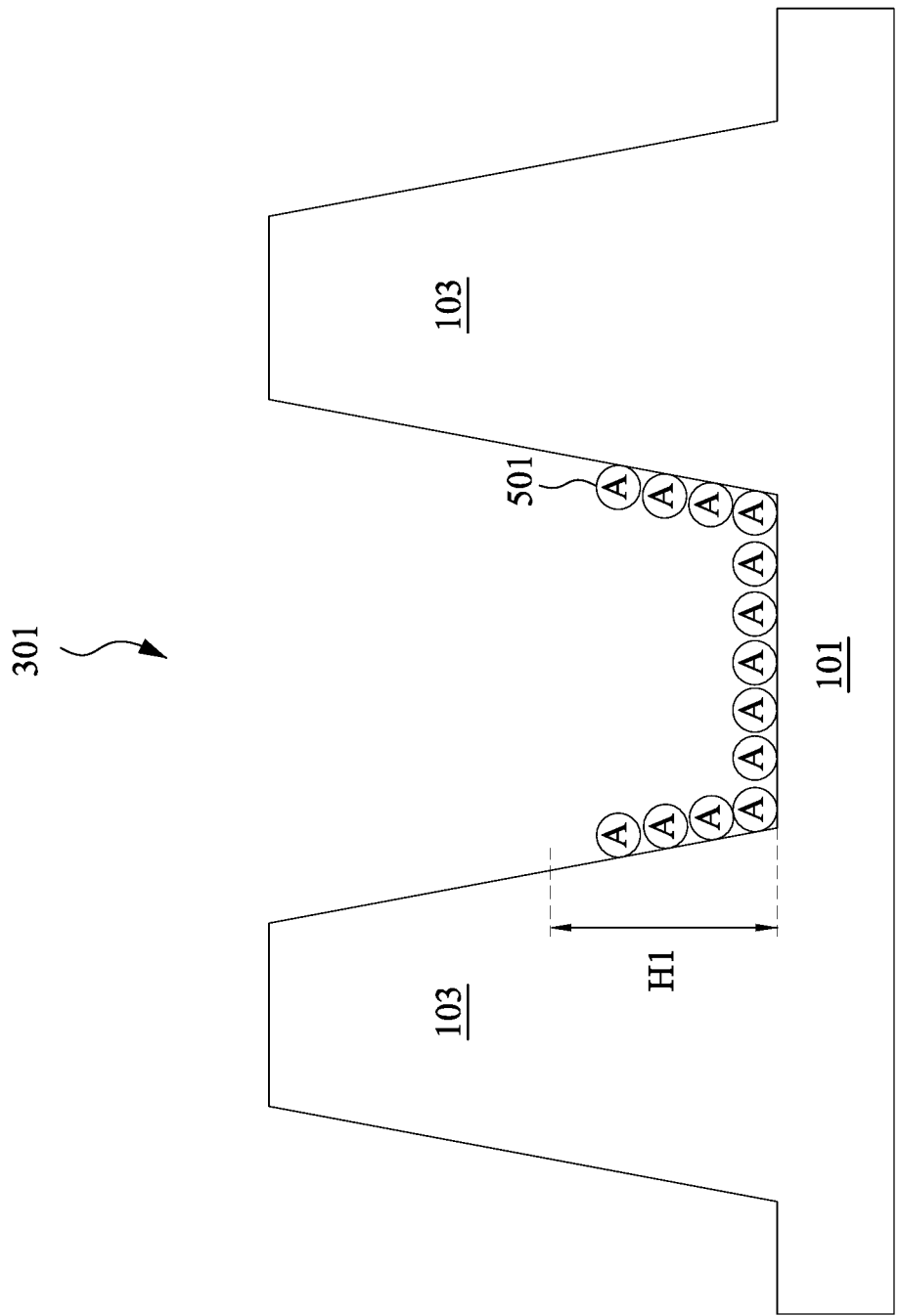

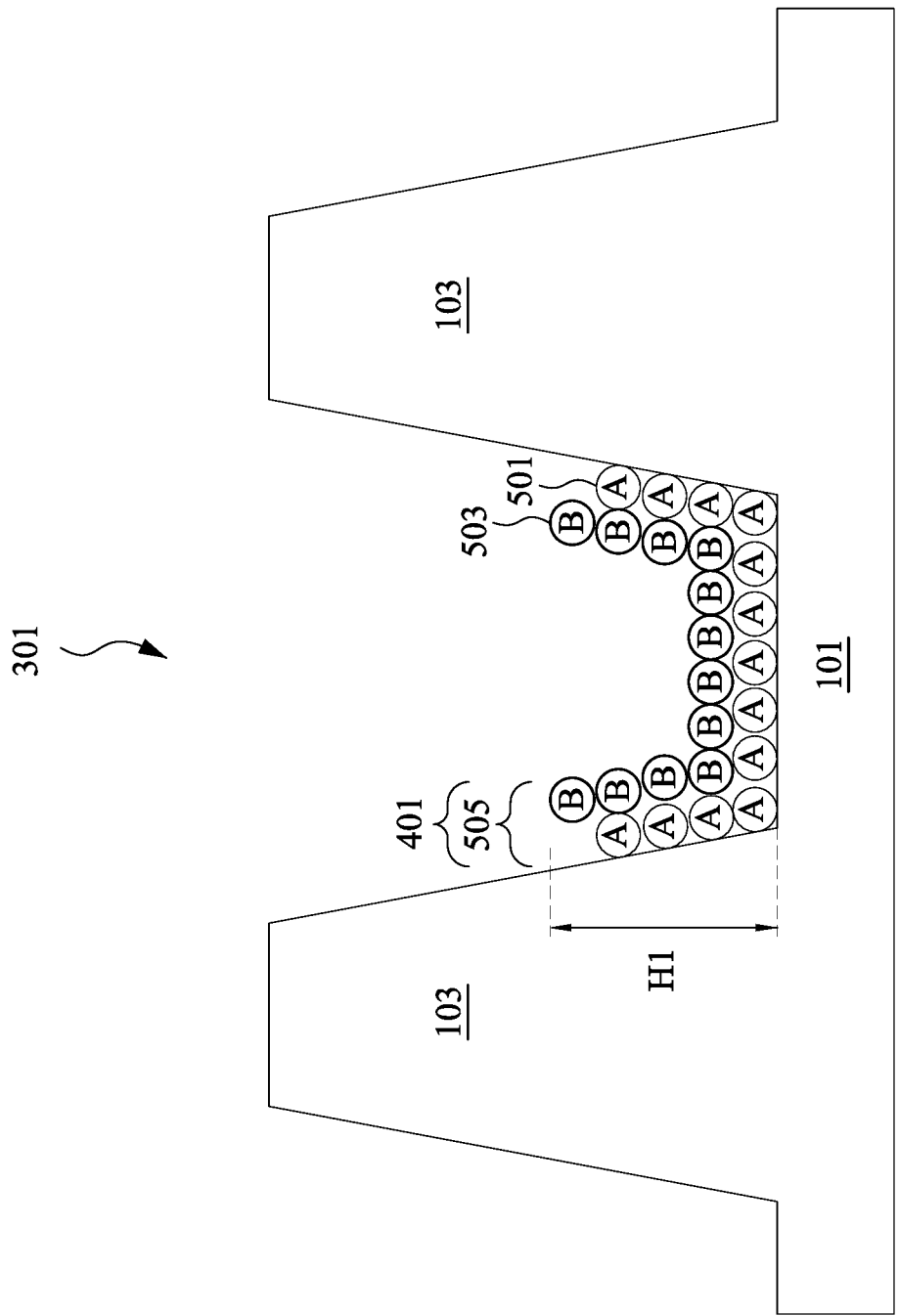

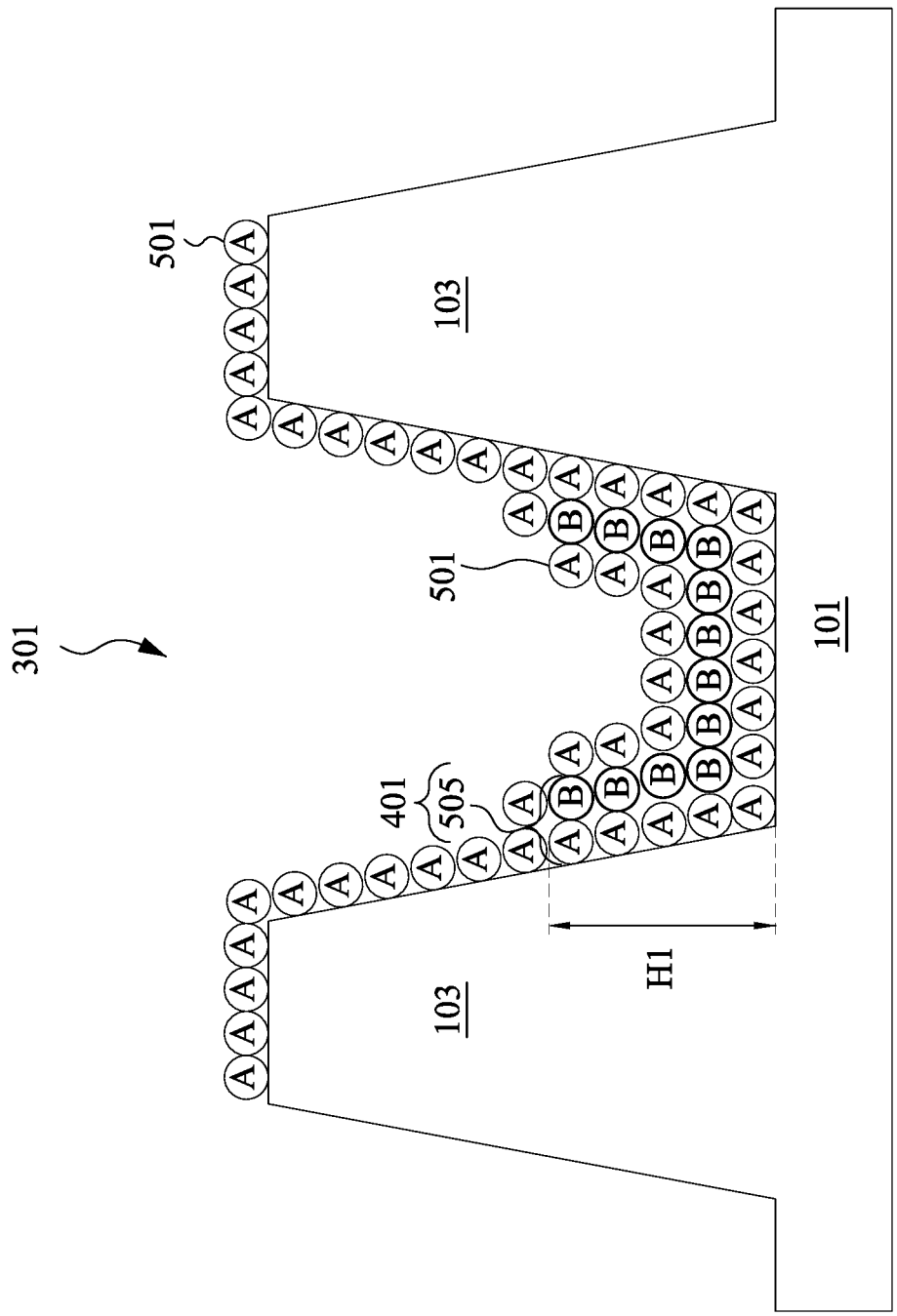

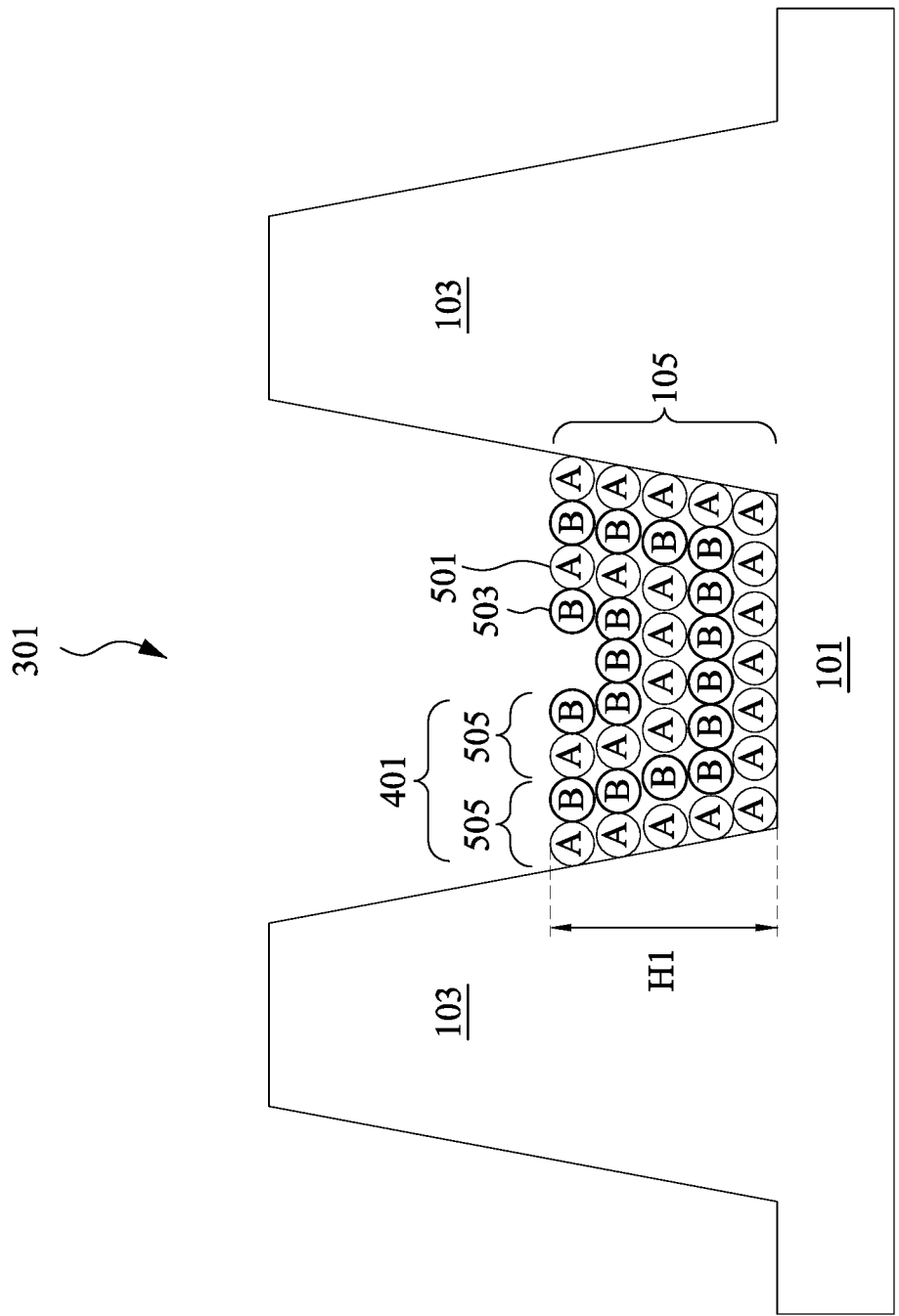

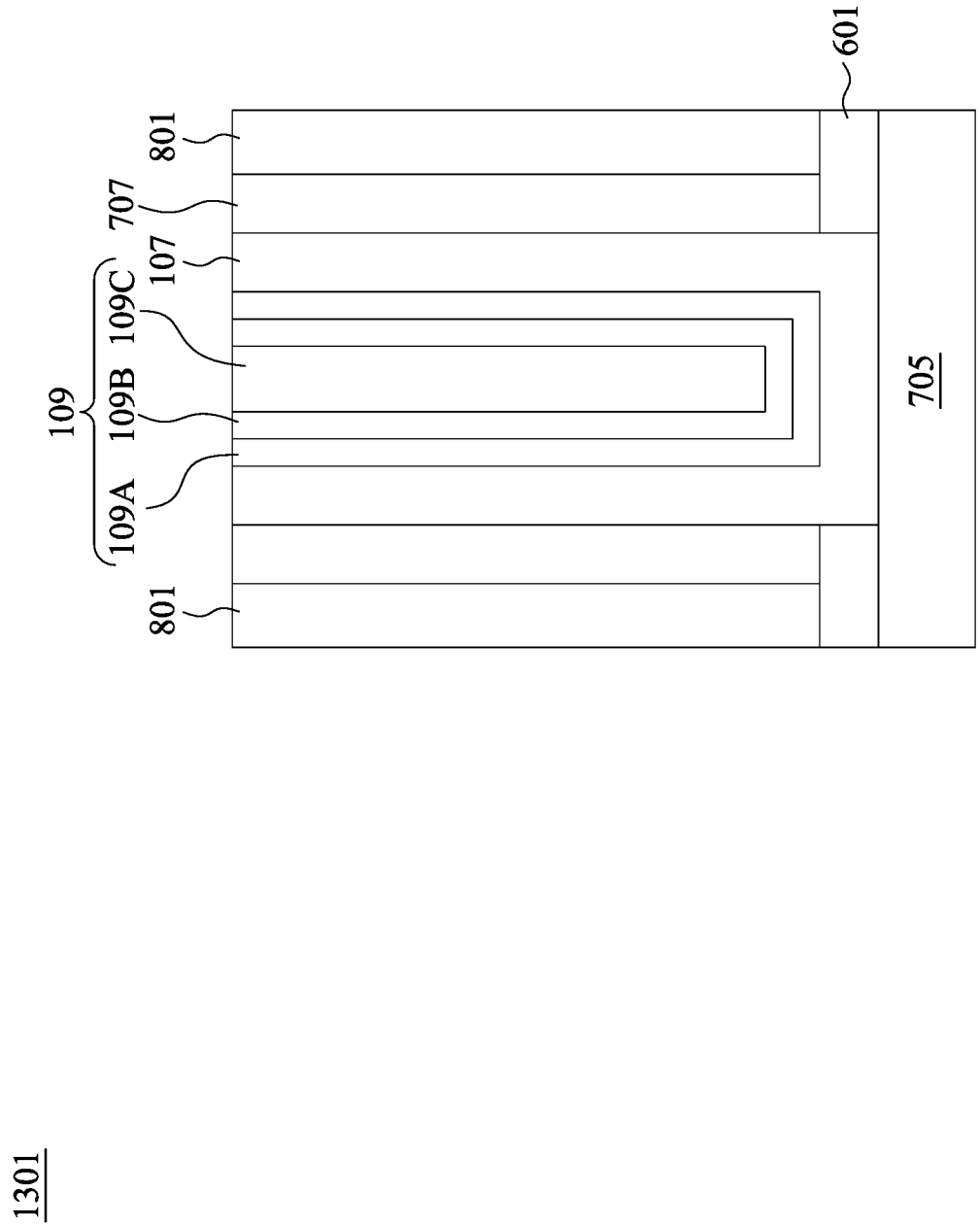

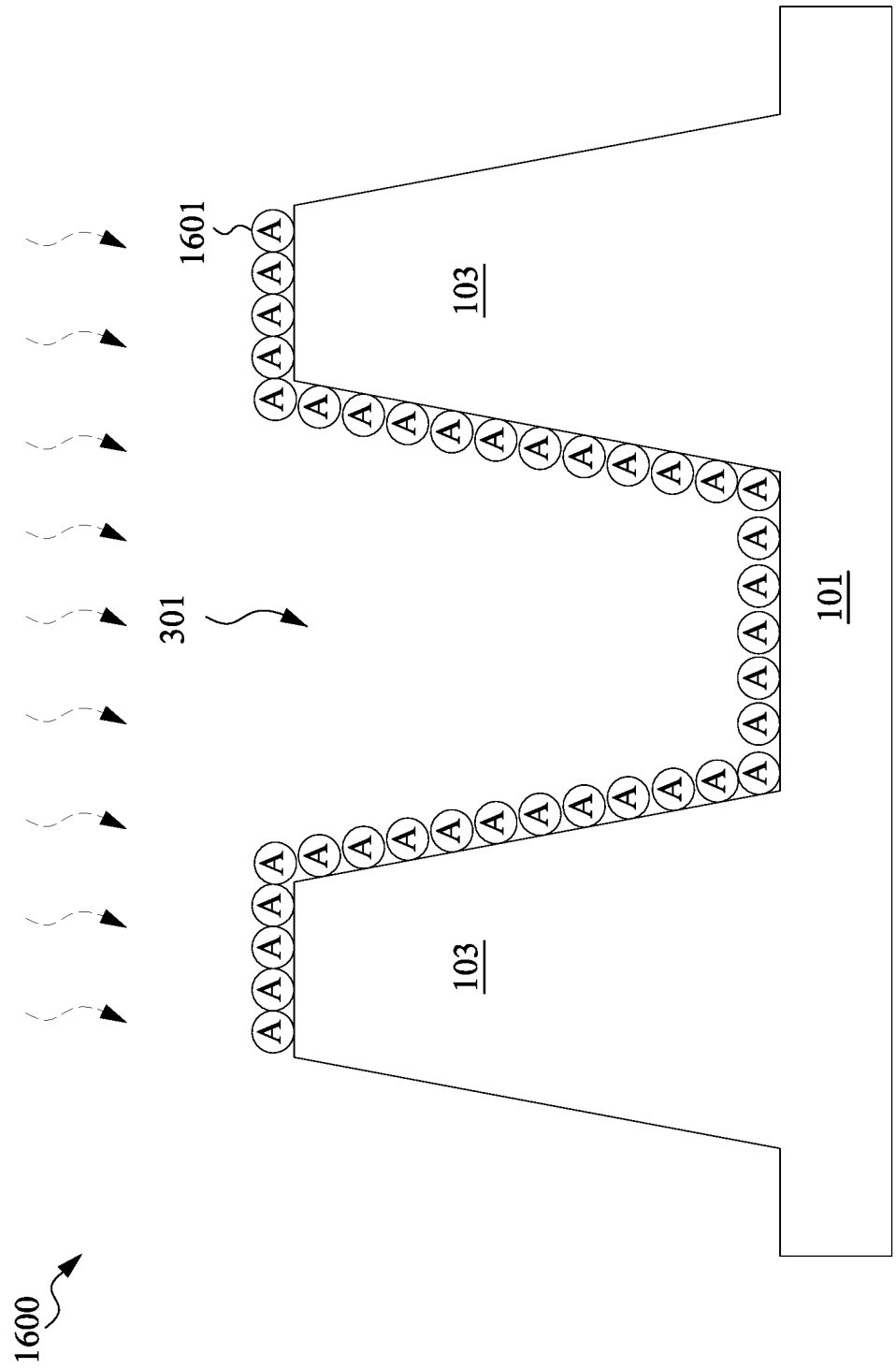

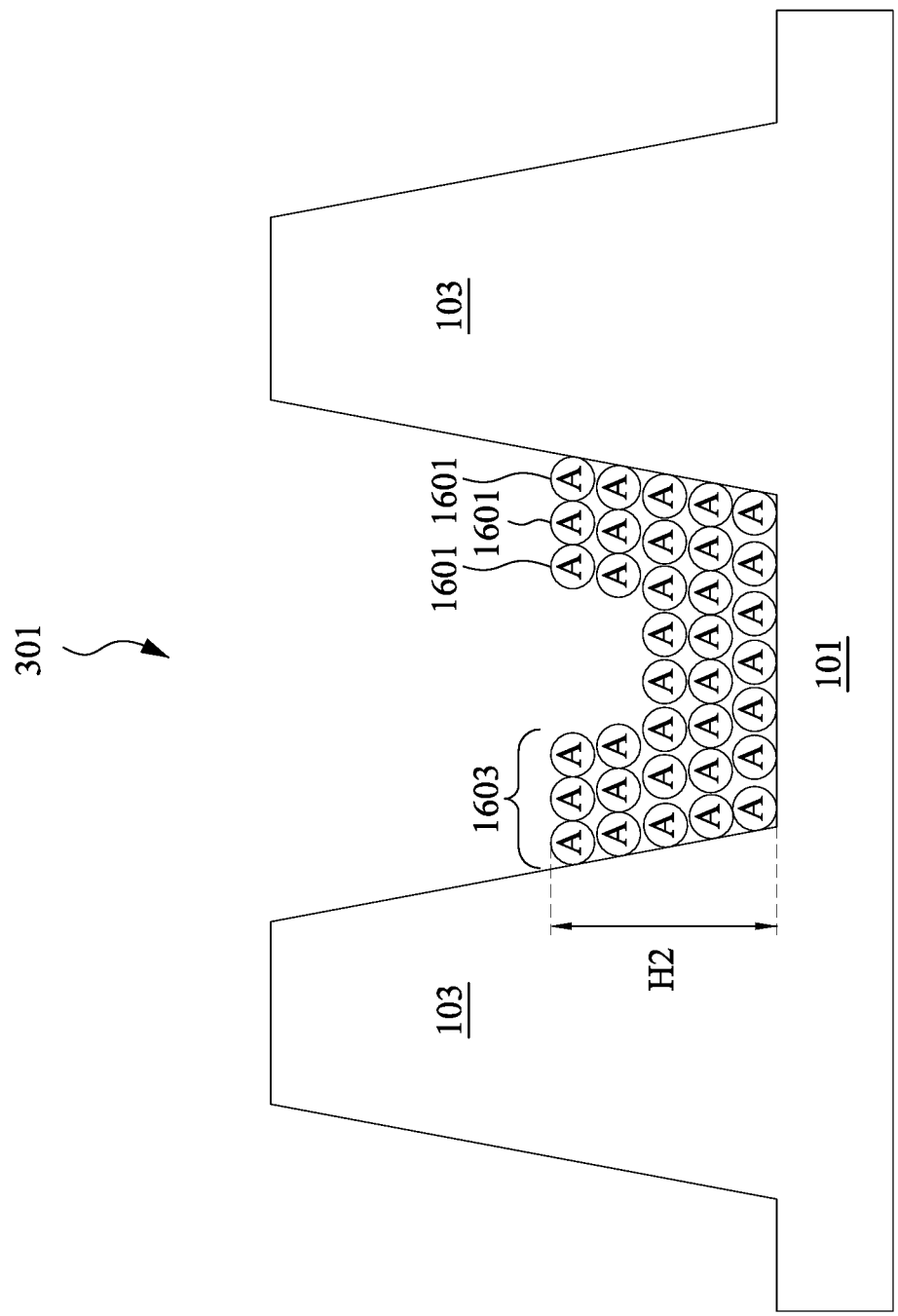

SEMICONDUCTOR DEVICES AND METHODS OF MANUFACTURE

PRIORITY CLAIM AND CROSS-REFERENCE

This application claims the benefit of U.S. Provisional Application No. 63/016,488, entitled: "Using Precursor Related Chemical to Create Special ALD/CVD Process," filed on Apr. 28, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 4A are cross-sectional views of intermediate stages in the manufacturing of FinFETs, in accordance with some embodiments.

FIGS. 5A to 5F illustrate, in a magnified view of a section highlighted in FIG. 4A, intermediates steps in the gap fill process, according to some embodiments.

FIGS. 16A to 16F illustrate, in a magnified view of a section highlighted in FIG. 4A, intermediates steps in the gap fill process, according to some other embodiments.

DETAILED DESCRIPTION

Figure 1:
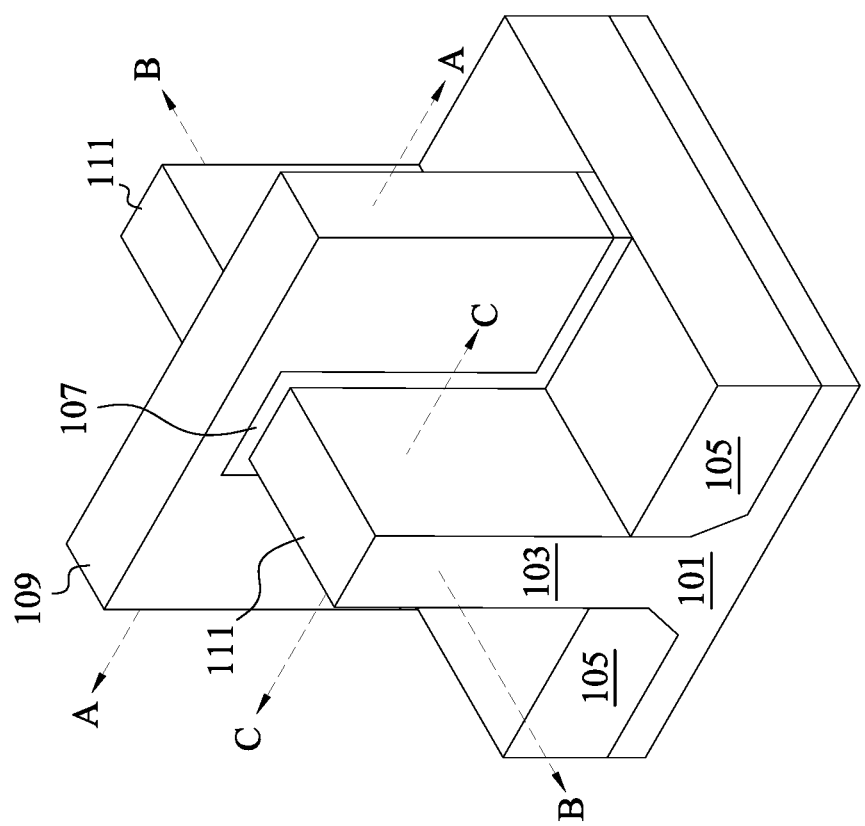
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein are directed towards semiconductor devices and methods of forming semiconductor devices. In particular, gap-fill deposition techniques and selective film deposition techniques used in the formation of semiconductor devices are disclosed herein. According to some embodiments, the gap-fill deposition techniques use gap-fill materials in an atomic layer deposition process to fill and/or overfill gaps formed within a workpiece. The gap-fill material may be a conductive material, a semiconductor material, a dielectric material. In some embodiments, the gap fill materials are dielectric materials that are deposited within a gap of a conductive material, dielectric materials, and/or a semiconductor material (e.g., semiconductor substrate). In other embodiments, the gap-fill materials are conductive materials and/or semiconductor materials that are deposited within a gap of a dielectric material (e.g., a hard mask layer, an interlayer dielectric layer, a polymer layer, or the like).

In still other embodiments, the selective film deposition techniques use selective film materials in an atomic layer deposition process or chemical vapor deposition (CVD) process to deposit a selective film on a target surface and/or a non-target surface. The selective film may be a dielectric material or may be a conductive material. In some embodiments, the selective film deposition is performed on a target surface and/or non-target surface silicon/metal over dielectric. In other embodiments, the selective film deposition is performed on a target surface and/or non-target surface such as dielectric over metal/silicon. However, other target surfaces and/or non-target surfaces may be used. These selective film techniques may be used in the formation of other structures such as selective liners, selective hard masks and may be applicable in intermediate stages of forming the semiconductor devices (e.g., front-end of the line (FEOL), middle of the line (MOL), and/or back-end of the line (BEOL)). Furthermore, these selective film techniques may be used in different technology generations including node 5, node 3, and beyond.

With reference now to FIG. 1, FIG. 1 illustrates an example of a FinFET in a three-dimensional view, in accordance with some embodiments. The FinFET comprises a fin 103 on a substrate 101 (e.g., a semiconductor substrate). Isolation regions 105 (e.g., shallow trench isolation (STI) regions) are disposed in the substrate 101, and the fin 103 protrudes above and from between neighboring isolation regions 105. Although the isolation regions 105 are described/illustrated as being separate from the substrate 101, as used herein the term "substrate" may be used to refer to just the semiconductor substrate or a semiconductor substrate inclusive of isolation regions. Additionally, although the fin 103 is illustrated as a single, continuous material as the substrate 101, the fin 103 and/or the substrate 101 may comprise a single material or a plurality of materials. In this context, the fin 103 refers to the portion extending between the neighboring isolation regions 105.

A gate dielectric layer 107 is along sidewalls and over a top surface of the fin 103, and a gate electrode 109 is over the gate dielectric layer 107. Source/drain regions 111 are disposed in opposite sides of the fin 103 with respect to the gate dielectric layer 107 and gate electrode 109. FIG. 1 further illustrates reference cross-sections that are used in later figures. Cross-section A-A is along a longitudinal axis of the gate electrode 109 and in a direction, for example, perpendicular to the direction of current flow between the source/drain regions 111 of the FinFET. Cross-section B-B is perpendicular to cross-section A-A and is along a longitudinal axis of the fin 103 and in a direction of, for example, a current flow between the source/drain regions 111 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

Furthermore, the embodiments discussed herein are discussed in the context of using the gap-fill deposition techniques in the formation of shallow trench isolation regions of the FinFETs. However, the gap-fill deposition techniques may be applied in filling gaps for the formation of other features of the devices, and all such embodiments do not depart from the spirit and scope of the present disclosure.

FIGS. 2 to 4A and 6 through 16B are cross-sectional views of intermediate stages in the manufacturing of FinFETs, in accordance with some embodiments. FIGS. 2 to 4A and 6 illustrate reference cross-section A-A illustrated in FIG. 1, except for multiple fins/FinFETs. FIGS. 7A, 8A, 9A, 10A, 11A, 12A, 13A, 14A, and 15A are illustrated along reference cross-section A-A illustrated in FIG. 1, and FIGS. 7B, 8B, 9B, 10B, 11B, 12B, 13B, 13C, 14B, and 15B are illustrated along a similar cross-section B-B that is illustrated in FIG. 1, except for multiple fins/FinFETs. FIGS. 9C and 9D are illustrated along reference cross-section C-C illustrated in FIG. 1, except for multiple fins/FinFETs. FIGS. 4B and 4C illustrate a system and a control unit respectively, for performing a gap-fill process according to some embodiments. FIGS. 5A-5F each illustrate, in a magnified view of a section highlighted in FIG. 4A, intermediate steps of an embodiment of the gap-fill process. FIGS. 16A-16F each illustrate, in a magnified view of the section highlighted in FIG. 4A, intermediate steps of another embodiment of the gap-fill process.

In FIGS. 2 to 4A and 6 through 16B, a process is described whereby a dielectric material is deposited within a gap between two adjacent semiconductor fins 103. However, the process described herein, while being described as being deposited between two adjacent semiconductor fins 103, the processes described are not limited to this embodiment, and may be utilized in any suitable embodiments. For example, in another embodiment, the gap filling deposition process can be utilized to fill a gap in a dielectric layer overlying active devices. The gap fill process may be used at any suitable step within the manufacturing process, and all such gap fill processes are fully intended to be included within the scope of the embodiments.

Figure 2:
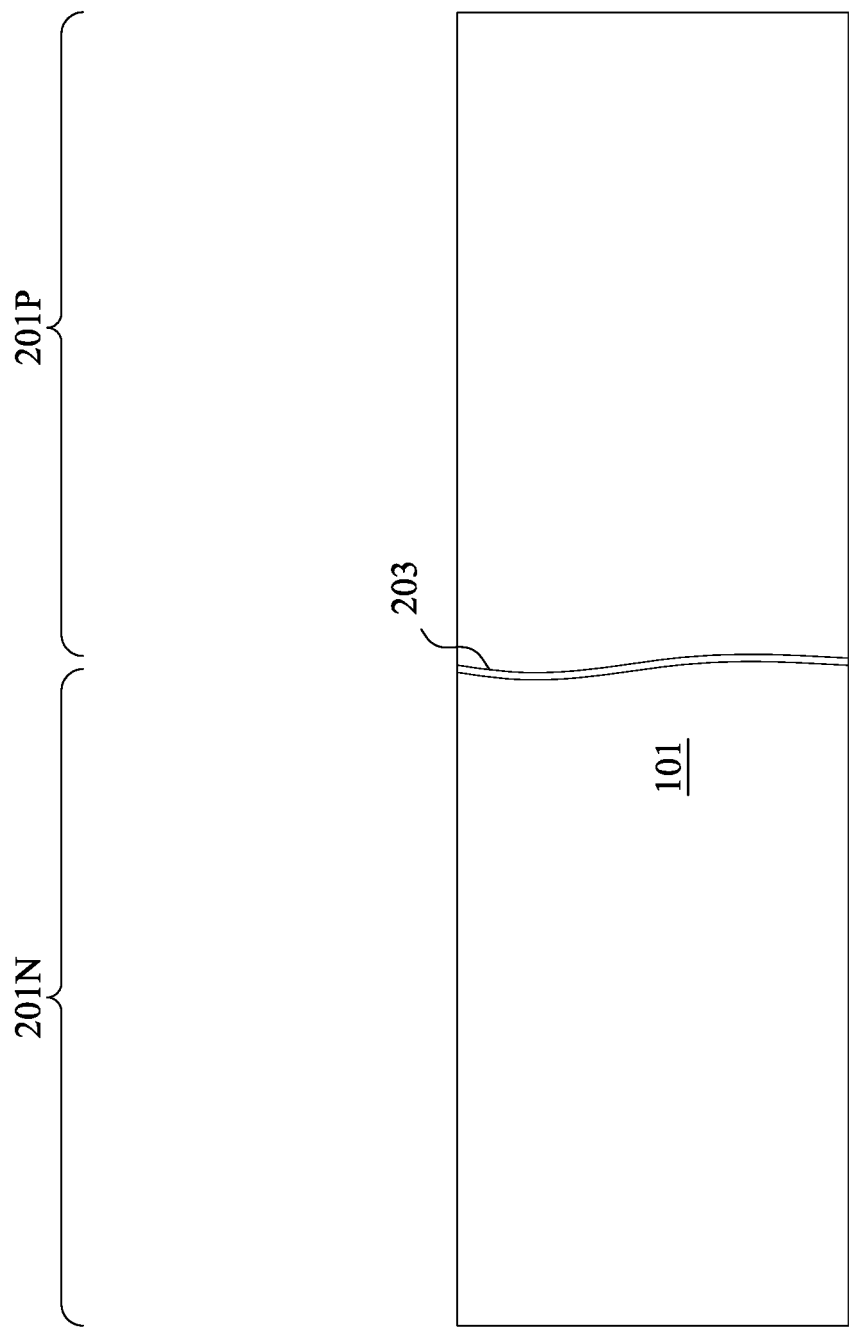

In FIG. 2, a substrate 101 is provided. The substrate 101 may be a semiconductor substrate, such as a bulk semiconductor, a semiconductor-on-insulator (SOI) substrate, or the like, which may be doped (e.g., with a p-type or an n-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 101 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 101 has an n-type region 201N and a p-type region 201P. The n-type region 201N can be for forming n-type devices, such as NMOS transistors, e.g., n-type FinFETs. The p-type region 201P can be for forming p-type devices, such as PMOS transistors, e.g., p-type FinFETs. The n-type region 201N may be physically separated from the p-type region 201P (as illustrated by divider 203), and any number of device features (e.g., other active devices, doped regions, isolation structures, etc.) may be disposed between the n-type region 201N and the p-type region 201P.

Figure 3:
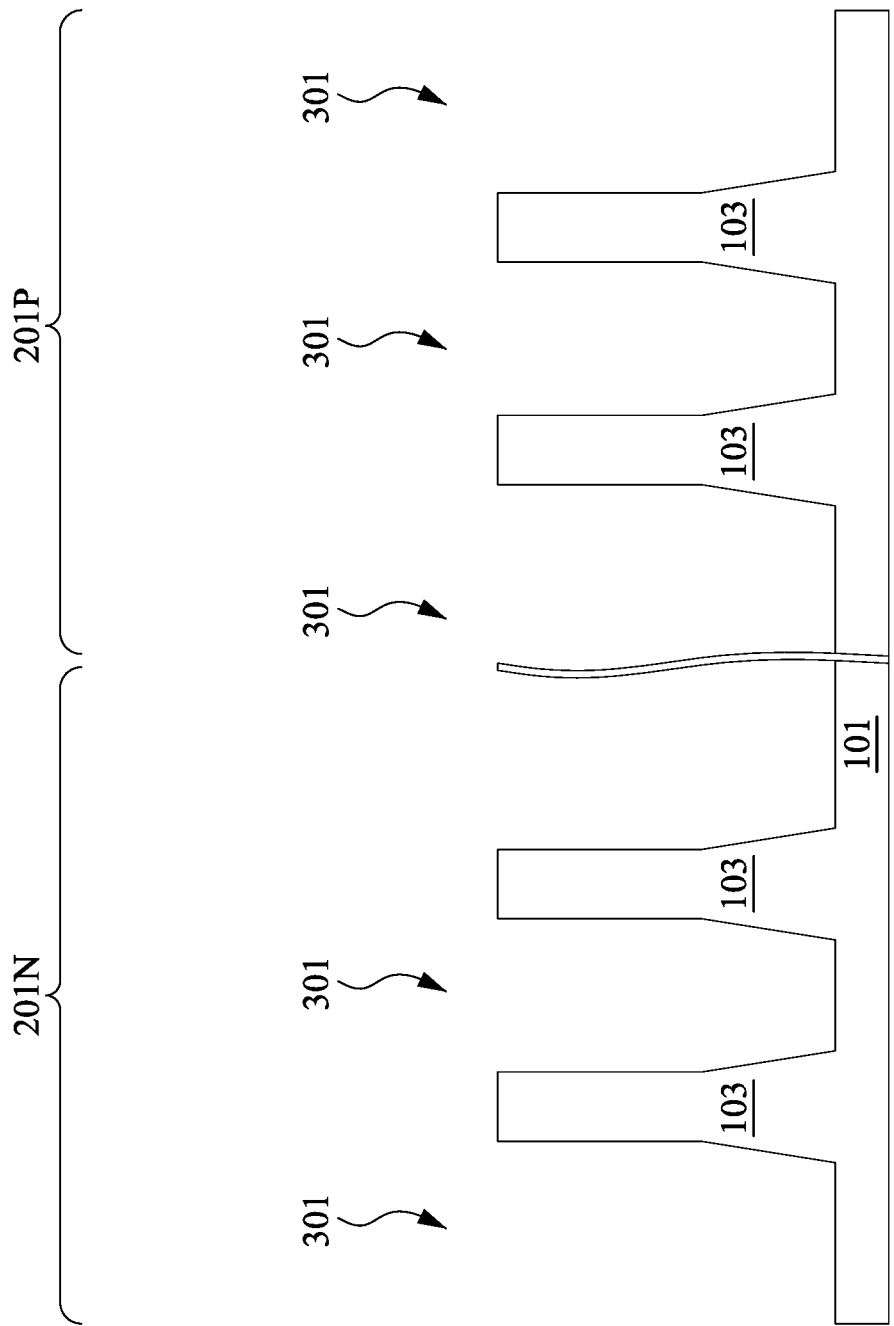

In FIG. 3, fins 103 are formed in the substrate 101. The fins 103 are semiconductor strips. In some embodiments, the fins 103 may be formed in the substrate 101 by etching trenches 301 in the substrate 101. The etching may be any acceptable etch process, such as a reactive ion etch (RIE), neutral beam etch (NBE), the like, or a combination thereof. The etch may be anisotropic. Furthermore, the trenches 301 may be formed to have aspect ratios of between about 5:1 and about 20:1. However, any suitable aspect ratio may be used.

The fins may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 103. In some embodiments, the mask (or other layer) may remain on the fins 103.

Figure 4A:
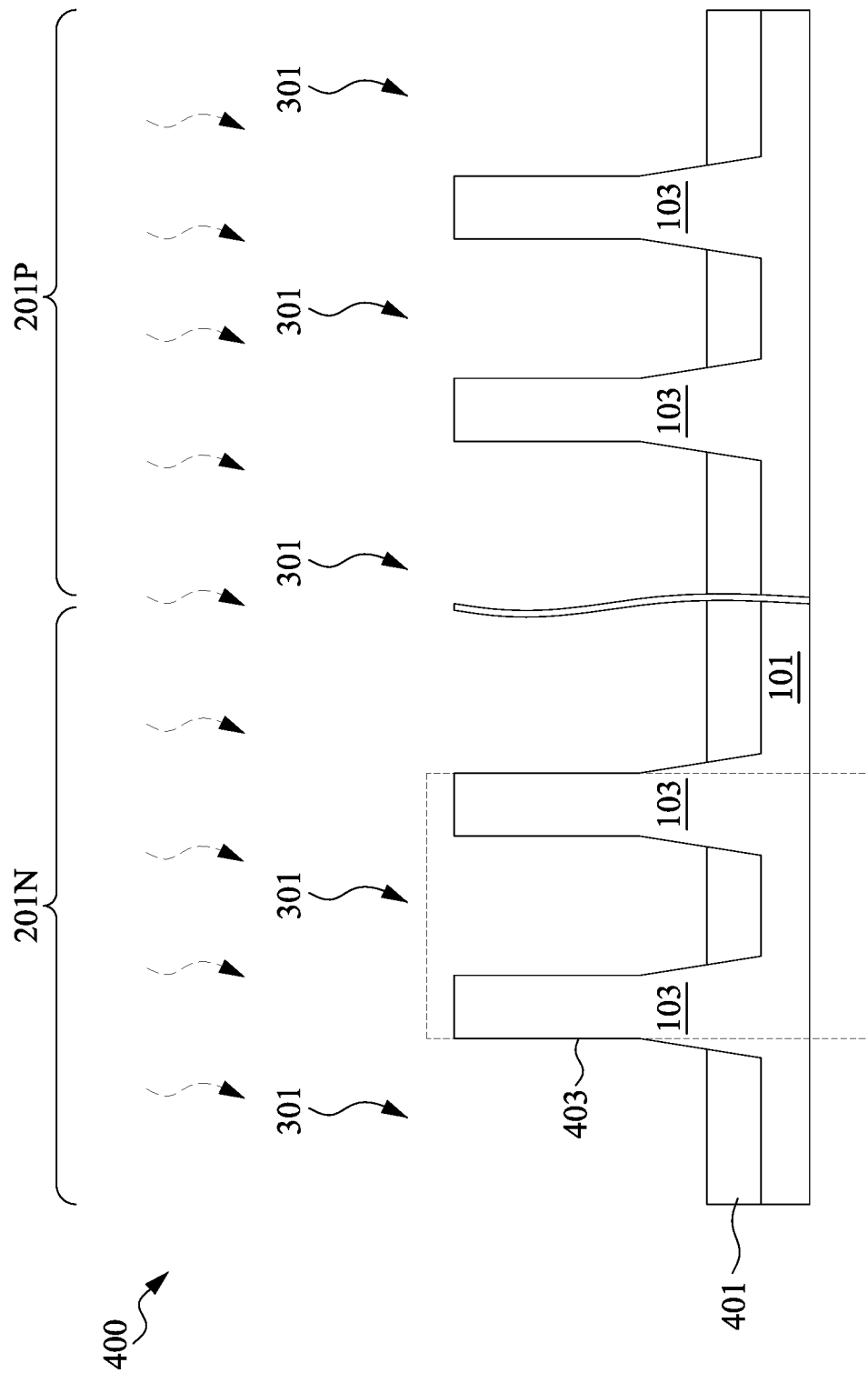
Figure 4B:
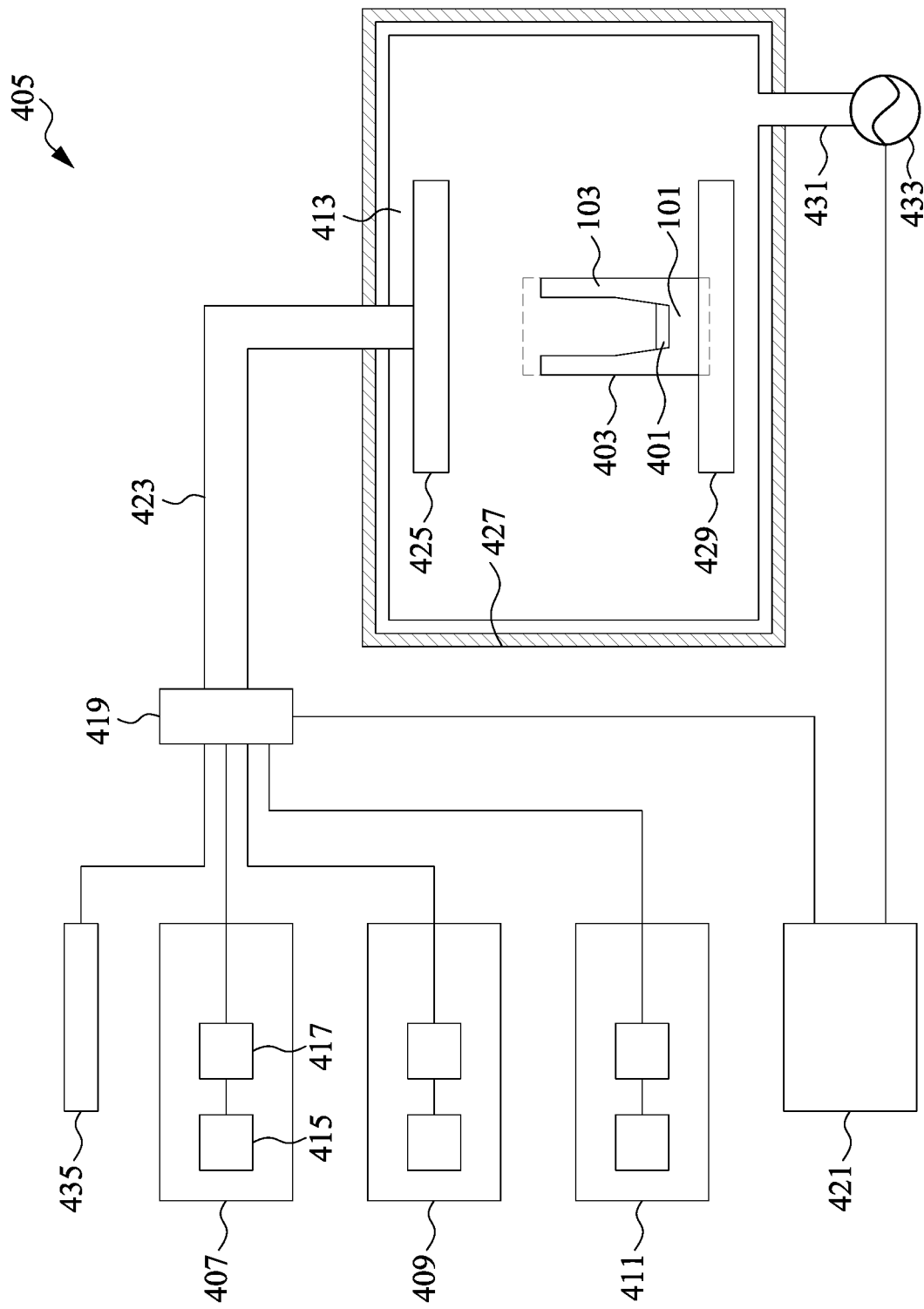
FIGS. 4B and 4C illustrate a system and a control unit for performing a gap-fill process, according to some embodiments.
Figure 4C:
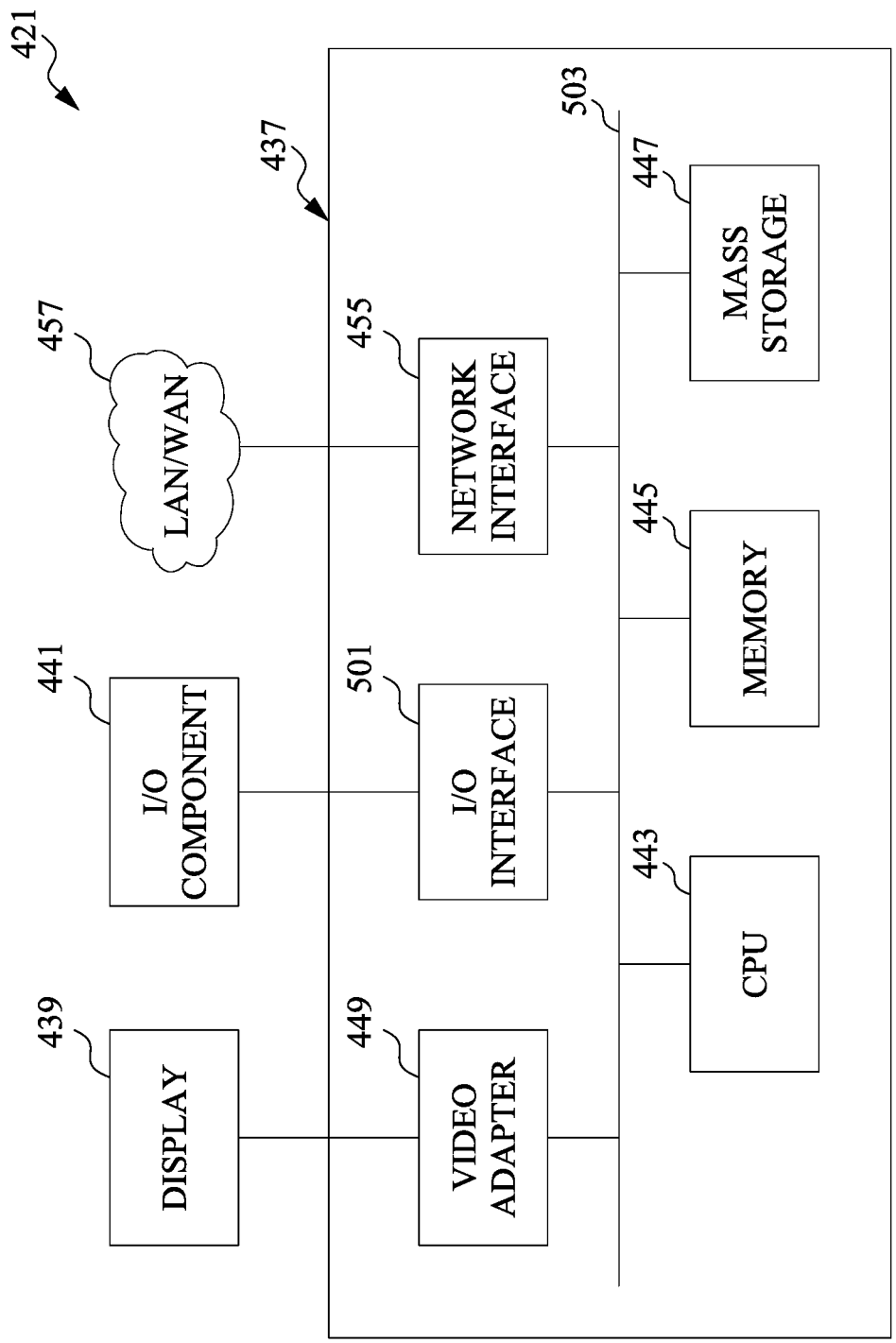

In FIGS. 4A to 4C illustrate a first gap-fill atomic layer deposition (ALD) process 400 and a deposition and etching system 405, according to some embodiments. In particular, FIG. 4A illustrates the first gap-fill ALD process 400 being used to form a first gap-fill material 401 within the trenches 301 in the eventual formation of the isolation regions 105 between neighboring ones of the fins 103, in accordance with a particular embodiment. FIG. 4A further illustrates a section 403 that is referenced in the following figures. FIG. 4B illustrates the deposition and etching system 405 for performing the first gap-fill ALD process 400, in accordance with some embodiments.

Although embodiments of the first gap-fill ALD process 400 are disclosed herein with regard to the example of filling the trenches 301 between fins 103 in the eventual formation of isolation regions 105, the first gap-fill ALD process 400 may be used to form a dielectric material or a semiconductor material in any suitable gap as an intermediate step in forming a semiconductor device, and all such embodiments do not depart from the spirit and scope of the present disclosure. In particular, the first gap-fill ALD process 400 may be used to form a void-less and seamless dielectric material or semiconductor material within a gap having an aspect ratio between about 5:1 and about 20:1. However, the first gap-fill ALD process 400 may also be used to fill gaps having other aspect ratios.

Turning to FIG. 4A, this figure shows the first gap-fill ALD process 400 being used to form the first gap-fill material 401 within the trenches 301, in accordance with some embodiments. In such embodiments, the first gap-fill material 401 may be a dielectric film such as silicon oxides or silicon nitrides (e.g., SiO, SiN, SiOC, SiOCN low-k spacer or high-k dielectric, SiCN), metal oxide (e.g., $Al_2O_3$, $TiO_2$), metal nitrides (e.g., AlN, TiN), or the like. In the illustrated embodiment, the isolation regions 105 are formed as silicon nitride (SiN) using the first gap-fill ALD process 400. Although the illustrated embodiment is shown performing the first gap-fill ALD process 400 in both the n-type region 201N and the p-type region 201P, the first gap-fill material 401 may also be deposited separately by using for example appropriate masking techniques to protect one of the regions while performing the first gap-fill ALD process 400 in the other region, and all such embodiments do not depart from the spirit and scope of the present disclosure.

FIG. 4B illustrates a deposition and etching system 405 for performing the first gap-fill ALD process 400, in accordance with some embodiments. The deposition and etching system 405 may be utilized to receive precursor materials from a first precursor delivery system 407, an etching precursor delivery system 409, and a second precursor delivery system 411, and to form layers of materials onto the substrate 101 between the fin 103. In an embodiment the first precursor delivery system 407, the etching precursor delivery system 409, and the second precursor delivery system 411 may work in conjunction with one another to supply the various different precursor materials and etching materials to a deposition and etching chamber 413 wherein the substrate 101 (and consequently the fin 103) are placed. However, the first precursor delivery system 407, the etching precursor delivery system 409, and the second precursor delivery system 411 may have physical components that are similar with each other.

For example, the first precursor delivery system 407, the etching precursor delivery system 409, and the second precursor delivery system 411 may each include a gas supply 415 and a flow controller 417 (labeled in FIG. 4B with regards to the first precursor delivery system 407 but not labeled for clarity with respect to the etching precursor delivery system 409 and the second precursor delivery system 411). In an embodiment in which the first precursor is stored in a gaseous state, the gas supply 415 may supply the first precursor to the deposition and etching chamber 413. The gas supply 415 may be a vessel, such as a gas storage tank, that is located either locally to the deposition and etching chamber 413 or else may be located remotely from the deposition and etching chamber 413. In other embodiments, the gas supply 415 may be a facility that independently prepares and delivers the first precursor to the flow controller 417. Any suitable source for the first precursor may be utilized as the gas supply 415, and all such sources are fully intended to be included within the scope of the embodiments.

The gas supply 415 may supply the desired precursor to the flow controller 417. The flow controller 417 may be utilized to control the flow of the precursor to a precursor gas controller 419 and, eventually, to the deposition and etching chamber 413, thereby also helping to control the pressure within the deposition and etching chamber 413. The flow controller 417 may be, e.g., a proportional valve, a modulating valve, a needle valve, a pressure regulator, a mass flow controller, combinations of these, or the like. However, any suitable method for controlling and regulating the flow of the carrier gas to a precursor canister (not separately illustrated) may be utilized, and all such components and methods are fully intended to be included within the scope of the embodiments.

However, as one of ordinary skill in the art will recognize, while the first precursor delivery system 407, the etching precursor delivery system 409, and the second precursor delivery system 411 have been described herein as having identical components, this is merely an illustrative example and is not intended to limit the embodiments in any fashion. Any type of suitable precursor delivery system, with any type and number of individual components identical to or different from any of the other precursor delivery systems within the deposition and etching system 405, may be utilized. All such precursor systems are fully intended to be included within the scope of the embodiments.

Additionally, in an embodiment in which the first precursor is stored in a solid or liquid state, the gas supply 415 may store a carrier gas and the carrier gas may be introduced into a precursor canister (not separately illustrated), which stores the first precursor in the solid or liquid state. The carrier gas is then used to push and carry the first precursor as it either evaporates or sublimates into a gaseous section of the precursor canister before being sent to the precursor gas controller 419. Any suitable method and combination of units may be utilized to provide the first precursor, and all such combinations of units are fully intended to be included within the scope of the embodiments.

The first precursor delivery system 407, the etching precursor delivery system 409, and the second precursor delivery system 411 may supply their individual precursor materials into the precursor gas controller 419. The precursor gas controller 419 connects and isolates the first precursor delivery system 407, the etching precursor delivery system 409, and the second precursor delivery system 411 from the deposition and etching chamber 413 in order to deliver the desired precursor materials to the deposition and etching chamber 413. The precursor gas controller 419 may include such devices as valves, flow meters, sensors, and the like to control the delivery rates of each of the precursors, and may be controlled by instructions received from the control unit 421 (described further below with respect to FIG. 4C).

The precursor gas controller 419, upon receiving instructions from the control unit 421, may open and close valves so as to connect one of the first precursor delivery system 407, the etching precursor delivery system 409, and the second precursor delivery system 411 to the deposition and etching chamber 413 and direct a desired precursor material through a manifold 423, into the deposition and etching chamber 413, and to a showerhead 425. The showerhead 425 may be utilized to disperse the chosen precursor material into the deposition and etching chamber 413 and may be designed to evenly disperse the precursor material in order to minimize undesired process conditions that may arise from uneven dispersal. In an embodiment the showerhead 425 may have a circular design with openings dispersed evenly around the showerhead 425 to allow for the dispersal of the desired precursor material into the deposition and etching chamber 413.

However, as one of ordinary skill in the art will recognize, the introduction of precursor materials to the deposition and etching chamber 413 through a single showerhead 425 or through a single point of introduction as described above is intended to be illustrative only and is not intended to be limiting to the embodiments. Any number of separate and independent showerheads 425 or other openings to introduce precursor materials into the deposition and etching chamber 413 may be utilized. All such combinations of showerheads 425 and other points of introduction are fully intended to be included within the scope of the embodiments.

The deposition and etching chamber 413 may receive the desired precursor materials and expose the precursor materials to the substrate 101 and the fins 103, and the deposition and etching chamber 413 may be any desired shape that may be suitable for dispersing the precursor materials and contacting the precursor materials with the substrate 101 and the fin 103. In the embodiment illustrated in FIG. 4B, the deposition and etching chamber 413 has a cylindrical sidewall and a bottom. However, the deposition and etching chamber 413 is not limited to a cylindrical shape, and any other suitable shape, such as a hollow square tube, an octagonal shape, or the like, may be utilized. Furthermore, the deposition and etching chamber 413 may be surrounded by a housing 427 made of material that is inert to the various process materials. As such, while the housing 427 may be any suitable material that can withstand the chemistries and pressures involved in the deposition process, in an embodiment the housing 427 may be steel, stainless steel, nickel, aluminum, alloys of these, combinations of these, and like.

Within the deposition and etching chamber 413 the substrate 101 may be placed on a mounting platform 429 in order to position and control the substrate 101 and the fin 103 during the deposition process. The mounting platform 429 may include heating mechanisms in order to heat the substrate 101 during the deposition process. Furthermore, while a single mounting platform 429 is illustrated in FIG. 4B, any number of mounting platforms 429 may additionally be included within the deposition and etching chamber 413.

Additionally, the deposition and etching chamber 413 and the mounting platform 429 may be part of a cluster tool system (not shown). The cluster tool system may be used in conjunction with an automated handling system in order to position and place the substrate 101 into the deposition and etching chamber 413 prior to the deposition process, position, hold the substrate 101 during the deposition process, and remove the substrate 101 from the deposition and etching chamber 413 after the deposition process.

The deposition and etching chamber 413 may also have an exhaust outlet 431 for exhaust gases to exit the deposition and etching chamber 413. A vacuum pump 433 may be connected to the exhaust outlet 431 of the deposition and etching chamber 413 in order to help evacuate the exhaust gases. The vacuum pump 433, under control of the control unit 421, may also be utilized to reduce and control the pressure within the deposition and etching chamber 413 to a desired pressure.

FIG. 4B further illustrates a purge gas delivery system 435. In an embodiment the purge gas delivery system 435 may be a gaseous tank or other facility that provides a purge gas such as nitrogen, argon, xenon, or other non-reactive gas to the deposition and etching chamber 413. Furthermore, the purge gas delivery system 435 and/or the vacuum pump 433, under control of the control unit 421, may also be utilized to evacuate precursor materials from the deposition and etching chamber 413 in preparation for the introduction of the next precursor material.

FIG. 4C illustrates an embodiment of the control unit 421 that may be utilized to control the precursor gas controller 419 and the vacuum pump 433. The control unit 421 may be any form of computer processor that can be used in an industrial setting for controlling process machines. In an embodiment the control unit 421 may comprise a processing unit 437, such as a desktop computer, a workstation, a laptop computer, or a dedicated unit customized for a particular application. The control unit 421 may be equipped with a display 439 and input/output (I/O) components 441, such as instruction outputs, sensor inputs, a mouse, a keyboard, printer, combinations of these, or the like. The processing unit 437 may include a central processing unit (CPU) 443, memory 445, a mass storage device 447, a video adapter 449, and an I/O interface 451 connected to a bus 453.

The bus 453 may be one or more of any type of several bus architectures including a memory bus or memory controller, a peripheral bus, or video bus. The CPU 443 may comprise any type of electronic data processor, and the memory 445 may comprise any type of system memory, such as static random access memory (SRAM), dynamic random access memory (DRAM), or read-only memory (ROM). The mass storage device 447 may comprise any type of storage device configured to store data, programs, and other information and to make the data, programs, and other information accessible via the bus 453. The mass storage device 447 may comprise, for example, one or more of a hard disk drive, a magnetic disk drive, or an optical disk drive.

The video adapter 449 and the I/O interface 451 provide interfaces to couple external input and output devices to the processing unit 437. As illustrated in FIG. 3, examples of input and output devices include the display 439 coupled to the video adapter 449 and the I/O components 441, such as a mouse, keyboard, printer, and the like, coupled to the I/O interface 451. Other devices may be coupled to the processing unit 437 and additional or fewer interface cards may be utilized. For example, a serial interface card (not shown) may be used to provide a serial interface for a printer. The processing unit 437 also may include a network interface 455 that may be a wired link to a local area network (LAN) or a wide area network (WAN) 457 and/or a wireless link.

It should be noted that the control unit 421 may include other components. For example, the control unit 421 may include power supplies, cables, a motherboard, removable storage media, cases, and the like. These other components, although not shown in FIG. 4C, are considered part of the control unit 421.

FIGS. 5A-5F illustrate, in magnified views of section 403 of FIG. 4A but not to scale, a series of atomic layer depositions and partial etching steps of the gap-fill ALD process 404, according to some embodiments. In particular, FIGS. 5A-5F illustrate an embodiment of the gap-fill ALD process 404 in which the first gap-fill material 401 is formed within the trenches 301 in the eventual formation of the isolation regions 105.

FIG. 5A illustrates a deposition of a first monolayer 501 formed over the fins 103 and within the trenches 301. In an embodiment the deposition and etching system 405 uses a first precursor material to deposit the first monolayer 501 onto the fin 103 and within the trenches 301. The first precursor material may be a chemical such as silicon (Si) with or without a halide group or may be a metal with or without a halide group (e.g., silane ($SiH_4$), di-silane ($Si_2H_6$), dichlorosilane (DCS) ($SiH_2Cl_2$), N-(Diethylaminosilyl)-N-ethylethanamine (SAM24), $TiCl_4$, $Al(CH_3)_3$, silicon tetrachloride ($SiCl_4$), or the like). In the illustrated embodiment, the first monolayer 501 may be formed using dichlorosilane (DCS) ($SiH_2Cl_2$) as the first precursor material. The first monolayer 501 may be formed in the deposition and etching chamber 413 utilizing a deposition process such as atomic layer deposition (ALD). However, this material and this process are intended to be illustrative and are not intended to be limiting, as other desirable materials, such as other dielectric materials, and other suitable deposition processes (e.g., chemical vapor deposition (CVD)), may be utilized.

In an embodiment the formation of the first monolayer 501 may be initiated by putting the first precursor material into the first precursor delivery system 407. For example, in an embodiment in which the first monolayer 501 is to be formed as a thin film of dichlorosilane, the first precursor material may be a precursor such as dichlorosilane and may be placed into the first precursor delivery system 407. However, as one of ordinary skill in the art will recognize, this precursor is not the only precursor that may be utilized to form a layer of dichlorosilane, and the use of dichlorosilane is not intended to be limiting to the embodiments. Any suitable precursor material in any suitable phase (solid, liquid, or gas) may be utilized.

Furthermore, a first etching precursor may be placed into the etching precursor delivery system 409. In the embodiment in which the first gap-fill material 401 is to be controlled to a desired height within the trenches 301, the first etching precursor may be an etch chemical such as hydrogen ($H_2$), a halide gas ($X_2$), a hydrogen halide gas (HX), or the like, which may be utilized as a plasma or not. The first etching precursor may be placed into the etching precursor delivery system 409 and may be used to partially etch the first monolayer 501 of the first precursor material. For example, in embodiments in which silane ($SiH_4$) or silicon tetrachloride ($SiCl_4$) is utilized as the first precursor material, $H_2$ plasma may be used as the first etching precursor and in embodiments in which the first precursor material is a metal, hydrochloric acid (HCl) gas may be used as the first etching precursor. However, the description of a halide etching gas as the first etching precursor is not intended to be limiting to the embodiments, and any other suitable first etching precursor, such as hydrogen, a hydrogen halide, combinations of these, or the like, may be utilized as the first etching precursor.

Additionally, a second precursor material may be placed into the second precursor delivery system 411. In the embodiment in which a layer of silicon nitride is to be formed for the first gap-fill material 401, the second precursor material may be a precursor material that may contain nitrogen in order to react with the first precursor material to form a thin film of silicon nitride. For example, in the embodiment in which dichlorosilane (DCS) is utilized as the first precursor material, ammonia ($NH_3$) may be used as the second precursor material and may be placed into the second precursor delivery system 411. However, the description of ammonia as the second precursor material is not intended to be limiting to the embodiments, and any other suitable precursor material, used to form any other suitable materials (e.g., an oxide) such as $O_2$, ozone, $N_2$, combinations of these, or the like in a high temperature deposition without a plasma or in a deposition with a plasma, may be utilized as the second precursor material.

Once the first precursor material, the first etching precursor, and the second precursor material have been placed into the first precursor delivery system 407, the etching precursor delivery system 409, and the second precursor delivery system 411 respectively, the formation of the first gap-fill material 401 may be initiated by the control unit 421 sending an instruction to the precursor gas controller 419 to connect the first precursor delivery system 407 to the deposition and etching chamber 413. Once connected, the first precursor delivery system 407 can deliver the first precursor material (e.g., the dichlorosilane) to the showerhead 425 through the precursor gas controller 419 and the manifold 423. The showerhead 425 can then disperse the first precursor material into the deposition and etching chamber 413, wherein the first precursor material can be adsorbed and react to the exposed surfaces of the substrate 101 and the fins 103.

In the embodiment to form a layer of silicon nitride, the first precursor material may be flowed into the deposition and etching chamber 413 at a flow rate of between about 1 slm and about 5 slm for about 50 second per cycle. Additionally, the deposition and etching chamber 413 may be held at a pressure of between about 3 torr and about 5 torr, and a temperature of between about 450° C. and about 700° C. However, as one of ordinary skill in the art will recognize, these process conditions are only intended to be illustrative, as any suitable process conditions may be utilized while remaining within the scope of the embodiments.

As the first precursor material is adsorbed onto the substrate 101 and the fins 103, the first precursor material will react with open active sites located on the exposed surfaces of the substrate 101 and the fins 103. However, once all of the open active sites on the substrate 101 and the fins 103 have reacted with the first precursor material, the reaction will stop, as there are no more open active sites to which the first precursor material will bond. This limitation causes the reaction of the first precursor material with the substrate 101 and the fins 103 to be self-limiting and to form a monolayer of the reacted first precursor material on the surface of the substrate 101 and the fins 103, thereby allowing for a more precise control of the thickness of the first monolayer 501.

After the self-limiting reaction on the substrate 101 and the fin 103 has finished, the deposition and etching chamber 413 may be purged of the first precursor material. For example, the control unit 421 may instruct the precursor gas controller 419 to disconnect the first precursor delivery system 407 (containing the first precursor material to be purged from the deposition and etching chamber 413) and to connect a purge gas delivery system 435 to deliver a purge gas to the deposition and etching chamber 413. In an embodiment the purge gas delivery system 435 may be a gaseous tank or other facility that provides a purge gas such as nitrogen, argon, xenon, or other non-reactive gas to the deposition and etching chamber 413. Additionally, the control unit 421 may also initiate the vacuum pump 433 in order to apply a pressure differential to the deposition and etching chamber 413 to aid in the removal of the first precursor material. The purge gas, along with the vacuum pump 433, may purge the first precursor material from the deposition and etching chamber 413 for about 3 seconds. However, any suitable time may be used.

Turning to FIG. 5B, after the purge of the first precursor material has been completed, the introduction of the first etching precursor (e.g., a halide gas) to the deposition and etching chamber 413 may be initiated by the control unit 421 sending an instruction to the precursor gas controller 419 to disconnect the purge gas delivery system 435 and to connect the etching precursor delivery system 409 (containing the first etching precursor) to the deposition and etching chamber 413. Once connected, the etching precursor delivery system 409 can deliver the first etching precursor to the showerhead 425. The showerhead 425 can then disperse the first etching precursor into the deposition and etching chamber 413, wherein the first etching precursor can be used to partially etch the first monolayer 501. According to some embodiments, the first monolayer 501 may be partially etched to a level at or below a desired height (e.g., first height H1) above the bottom of the trenches 301. According to some embodiments, the partial etch is a dry etch or a plasma etch and is timed to stop at the desired height within the trenches 301. However, any suitable etching process and/or process conditions may be used.

By utilizing a timed etch, the non-consumed portion of the first monolayer 501 remains at the bottom of the trenches 301. In particular embodiments in which the first gap-fill material 401 is eventually formed into the isolation regions 105, the first height H1 may be between about 20 nm and about 50 nm. However, any suitable height may be used. As such, the surfaces of the fins 103 are exposed above the first height H1 by the partial etching of the first monolayer 501.

In the embodiment discussed above to partially etch the first monolayer 501 in which dichlorosilane is used as the first precursor material, the high temperature halide gas may be introduced into the deposition and etching chamber 413 at a flow rate of between about 0.1 slm and about 1.0 slm, for about 3 seconds to about 20 seconds. Additionally, the deposition and etching chamber 413 may be held at a pressure of between about 0 torr and about 150 torr and a temperature of between about 75° C. and about 550° C. However, as one of ordinary skill in the art will recognize, these process conditions are only intended to be illustrative, as any suitable process conditions may be utilized to introduce other suitable etching chemicals using other suitable process conditions while remaining within the scope of the embodiments.

After the partial etching of the first monolayer 501 has finished, the deposition and etching chamber 413 may be purged of the first etching precursor. For example, the control unit 421 may instruct the precursor gas controller 419 to disconnect the etching precursor delivery system 409 (containing the first etching precursor to be purged from the deposition and etching chamber 413) and to connect the purge gas delivery system 435 to deliver the purge gas to the deposition and etching chamber 413. Additionally, the control unit 421 may also initiate the vacuum pump 433 in order to apply a pressure differential to the deposition and etching chamber 413 to aid in the removal of the first etching precursor. The purge gas, along with the vacuum pump 433, may purge the first etching precursor from the deposition and etching chamber 413 for about 3 seconds. However, any suitable time may be used.

Turning to FIG. 5C, after the first etching precursor has been purged, the introduction of the second precursor material (e.g., ammonia ($NH_3$)) to the deposition and etching chamber 413 may be initiated by the control unit 421 sending an instruction to the precursor gas controller 419 to disconnect the purge gas delivery system 435 and to connect the second precursor delivery system 411 (containing the second precursor material) to the deposition and etching chamber 413. Once connected, the second precursor delivery system 411 can deliver the second precursor material to the showerhead 425. The showerhead 425 can then disperse the second precursor material into the deposition and etching chamber 413. As such, a second monolayer 503 of the second precursor material (e.g., ammonia) can be adsorbed on the remaining surfaces of the first monolayer 501 (e.g., dichlorosilane (DCS) ($SiH_2Cl_2$)) and react with the first monolayer 501 in another self-limiting reaction to form a thin film 505 of the first gap-fill material 401, e.g., silicon nitride (SiN), on the surface of the substrate 101 and the fins 103.

In the embodiment discussed above to form a layer of silicon nitride with dichlorosilane, the ammonia may be introduced into the deposition and etching chamber 413 at a flow rate of between about 2 slm and about 10 slm, for about 30 seconds. Additionally, the deposition and etching chamber 413 may be held at a pressure of between about 0 torr and about 150 torr and held at a temperature of between about 450° C. and about 700° C. However, as one of ordinary skill in the art will recognize, these process conditions are only intended to be illustrative, as any suitable process conditions may be utilized to introduce any suitable precursor material while remaining within the scope of the embodiments.

After the thin film 505 of the first gap-fill material 401, e.g., silicon nitride, has been formed, the second precursor may be purged from the deposition and etching chamber 413 using, e.g., the purge gas from the purge gas delivery system 435 for about three seconds. Once the deposition and etching chamber 413 has been purged, a first cycle for the formation of the first gap-fill material 401 has been completed such that a first layer of the thin film 505 is left behind at the bottom of the trenches 301.

Turning to FIG. 5D, once the first cycle for the formation of the first gap-fill material 401 has been completed, a second cycle similar to the first cycle may be started. According to some embodiments, the second cycle may be initiated by forming another layer of the first monolayer 501 (e.g., dichlorosilane) over the thin film 505 of the first gap-fill material 401. Formation of the first monolayer 501 may be initiated by the control unit 421 sending an instruction to the precursor gas controller 419 to disconnect the purge gas delivery system 435 and to connect the first precursor delivery system 407 (containing the first precursor material) to the deposition and etching chamber 413. Once connected, the first precursor delivery system 407 can deliver the first precursor material to the showerhead 425. As such another layer of the first monolayer 501 is formed over the thin film 505 and along exposed surfaces of the fins 103.

As the first precursor material is adsorbed onto the thin film 505 (e.g., silicon nitride) and the fins 103, the first precursor material will react with open active sites located on the exposed surfaces of the thin film 505 and the fins 103. However, once all of the open active sites on the thin film 505 and the fins 103 have reacted with the first precursor material, the reaction will stop, as there are no more open active sites to which the first precursor material will bond. This limitation causes the reaction of the first precursor material with the thin film 505 and the fins 103 to be self-limiting and to form a monolayer of the reacted first precursor material (e.g., DCS ($SiH_2Cl_2$)) on the surface of the thin film 505 and the fins 103, thereby allowing for a more precise control of the thickness of the first monolayer 501. After the self-limiting reaction on the thin film 505 and the fin 103 has finished, the deposition and etching chamber 413 may be purged of the first precursor material.

Figure 5E:
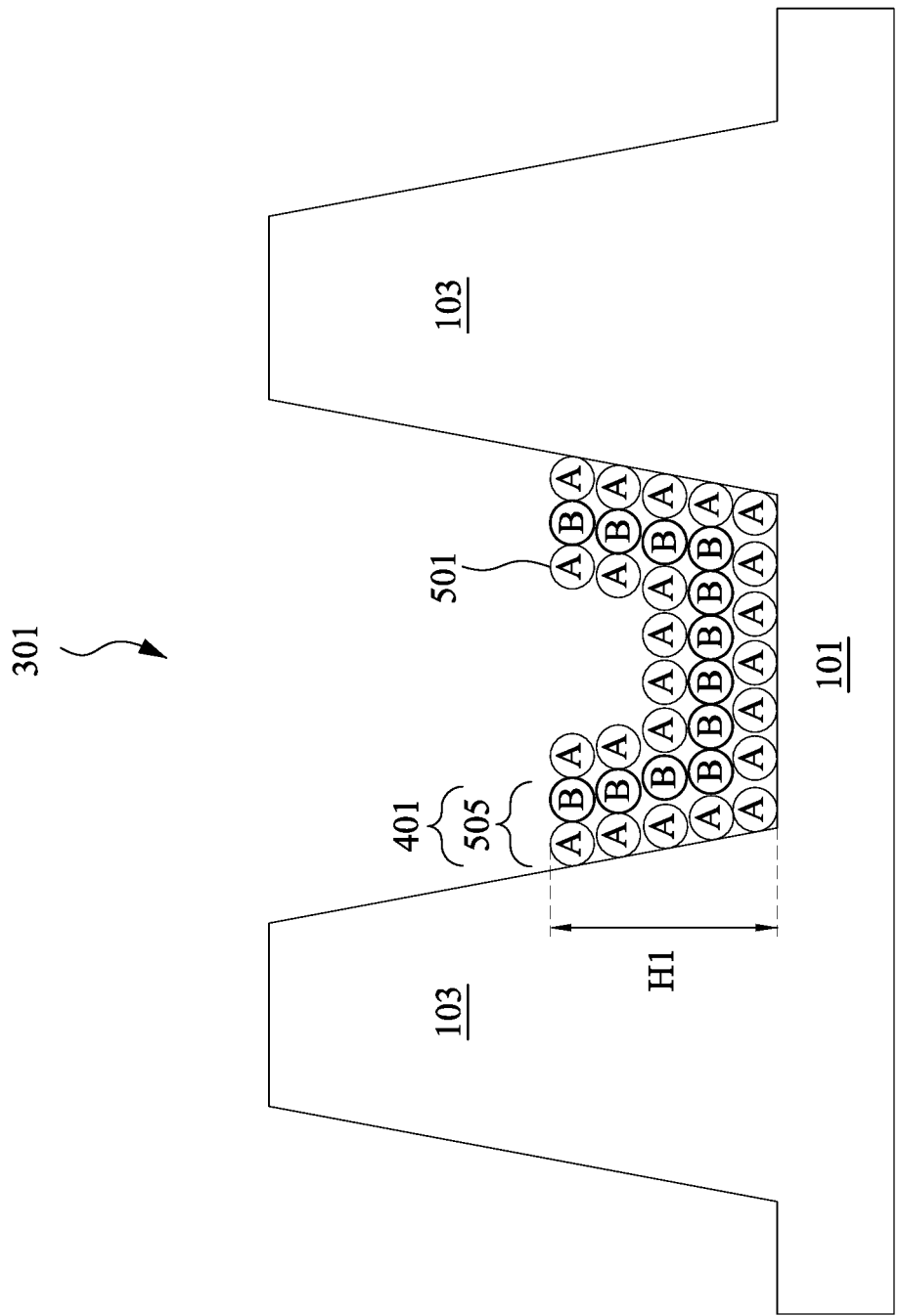

Continuing to FIG. 5E, the second cycle may continue by re-introduction of the first etching precursor (e.g., halide gas) to perform the partial etch of the first monolayer 501. Re-introduction of the first etching precursor to the deposition and etching chamber 413 may be initiated by the control unit 421 sending an instruction to the precursor gas controller 419 to disconnect the purge gas delivery system 435 and to re-connect the etching precursor delivery system 409. Once re-connected, the etching precursor delivery system 409 can deliver the first etching precursor to the showerhead 425 to disperse the first etching precursor into the deposition and etching chamber 413, wherein the first etching precursor is used to partially etch the first monolayer 501 formed over the thin film 505 and the fins 103. According to some embodiments, the first monolayer 501 may be partially etched to a level at or below the desired height (e.g., first height H1) above the bottom of the trenches 301. As such, the non-consumed portion of the first monolayer 501 remains over the thin film 505 at the bottom of the trenches 301 and the surfaces of the fins 103 are exposed above the first height H1.

Continuing to FIG. 5F, the second cycle may continue by re-introduction of the second precursor material (e.g., ammonia) to form another second monolayer 503 over the non-consumed portion of the first monolayer 501 within the trenches 301. Re-introduction of the second precursor material to the deposition and etching chamber 413 may be initiated by the control unit 421 sending an instruction to the precursor gas controller 419 to disconnect the purge gas delivery system 435 and to re-connect the second precursor delivery system 411. Once re-connected, the second precursor delivery system 411 can deliver the second precursor material to the showerhead 425 to disperse the second precursor material into the deposition and etching chamber 413. As such, a second monolayer 503 of the second precursor material can be adsorbed on the remaining surfaces of the non-consumed portion of the first monolayer 501 disposed over the first layer of the thin film 505. The second monolayer 503 reacts with the first precursor material of the first monolayer 501 in another self-limiting reaction to form another thin film 505 of the first gap-fill material 401, e.g., silicon nitride, over the first layer of the thin film 505.

After the self-limiting reaction has complete and the second layer of the thin film 505 has been formed, the second precursor may be purged from the deposition and etching chamber 413. Once the deposition and etching chamber 413 has been purged, a second cycle for the formation of the first gap-fill material 401 has been completed such that a second layer of the thin film 505 is disposed over the first layer of the thin film 505 at the bottom of the trenches 301.

Further cycles may be repeated in the manner disclosed above to continue to fill the trenches 301 in a void-less and seamless deposition of the first gap-fill material 401. These cycles may be repeated until the first gap-fill material 401 fills the area of the trenches 301 to the desired thickness (e.g., the first height H1). However, other desirable thicknesses of the first gap-fill material 401, including filling and/or overfilling the trenches 301, may be achieved by performing more cycles or less cycles. Once the desired thickness of the first gap-fill material 401 has been reached, the substrate 101 may be removed from the deposition and etching chamber 413 for further processing.

However, as one of ordinary skill in the art will recognize, the above described process to form the first gap-fill material 401 is intended to be illustrative and is not intended to be limiting to the embodiments. Any other suitable process to form the first gap-fill material 401 may be utilized and are fully intended to be included within the scope of the embodiments.

In some other embodiments, the first gap-fill material 401 may be formed not to partially fill the trenches 301 (described above), but is formed to initially fully fill and/or overfill the trenches 301 and to cover the fins 103. In such other embodiments, a removal process is applied to the first gap-fill material 401 to remove excess material of the first gap-fill material 401 over the fins 103. In some embodiments, a planarization process such as a chemical mechanical polish (CMP), an etch-back process, combinations thereof, or the like may be utilized. The planarization process exposes the fins 103 such that top surfaces of the fins 103 and the first gap-fill material 401 are level after the planarization process is complete.

Once planarized, the first gap-fill material 401 is recessed to form the isolation regions 105 to a desired height. According to some embodiments, the first gap-fill material 401 is recessed to a desired height (e.g., the first height H1) and such that upper portions of fins 103 in the n-type region 201N and in the p-type region 201P protrude from between neighboring isolation regions 105. Further, the top surfaces of the isolation regions 105 may have a flat surface as illustrated, a convex surface, a concave surface (such as dishing), or a combination thereof by using an appropriate etch. The isolation regions 105 may be recessed using an acceptable etching process, such as one that is selective to the material of the first gap-fill material 401 (e.g., etches the material of the first gap-fill material 401 at a faster rate than the material of the fins 103). According to some embodiments, once the desired thickness of the first gap-fill material 401 has been reached an optional anneal process and/or optional treatment (e.g., oxidation treatment, densification treatment, or the like) may be performed on the first gap-fill material 401 to form the isolation regions 105. Once the isolation regions 105 have been formed, the substrate 101 may be removed from the deposition and etching chamber 413 for further processing. Although the isolation regions 105 are illustrated as a single layer, some embodiments may utilize multiple layers. For example, in some embodiments a liner (not shown) may first be formed along a surface of the substrate 101 and the fins 103. Thereafter, a fill material, such as those discussed above may be formed over the liner.

Although the embodiments of the first gap-fill process 400 are directed towards forming a first gap-fill material 401 in a first gap 301 in the eventual formation of the isolation regions 105 (see FIG. 1), the first gap-fill process 400 may also be utilized to fill other gaps in the eventual formation of other structures. The first gap-fill process 400 may be used to fill any target gap in which the first monolayer 501 reacts in a self-limiting reaction with the material in which the target gap is formed and the second monolayer 503 reacts in a self-limiting reaction with the first monolayer 501 to form a thin film of the first fill material 401 within the target gap. Examples of other structures that may be formed using the first gap-fill process 400 include, but are not limited to, structures such as dummy gate electrodes, gate spacers, top spacers, bottom spacers, dummy masks, source/drain regions, gate contacts, source/drain contacts, dielectric plugs, or the like.

Additionally, the process described with respect to FIGS. 2 through 3 is just one example of how the fins 103 may be formed and with respect to FIGS. 4A through 5F is just one example of how the isolation regions 105 may be formed. In some embodiments, heteroepitaxial structures can be used for the fins 103. For example, in embodiments in which the first gap-fill material 401 is initially formed to fill and overfill the trenches 301 and prior to recessing the first gap-fill material 401 to form the isolation regions 105, the fins 103 can be recessed, and a material different from the fins 103 may be epitaxially grown over the recessed fins 103. In such embodiments, the fins 103 comprise the recessed material as well as the epitaxially grown material disposed over the recessed material. In still further embodiments, homoepitaxial structures that are a different material from the substrate 101 can be used for the fins 103. For example, in embodiments in which the first gap-fill material 401 is initially formed to fill and overfill the trenches 301, the fins 103 can be recessed, and a material different from the substrate 101 may be epitaxially grown in place of the recessed fins 103. In such embodiments, the fins 103 comprise the epitaxially grown material grown from the substrate 101. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 201N (e.g., an NMOS region) different from the material in p-type region 201P (e.g., a PMOS region). In various embodiments, upper portions of the fins 103 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Furthermore, appropriate wells (not shown) may be formed in the fins 103 and/or the substrate 101. In some embodiments, a P well may be formed in the n-type region 201N, and an N well may be formed in the p-type region 201P. In some embodiments, a P well or an N well are formed in both the n-type region 201N and the p-type region 201P.

In the embodiments with different well types, the different implant steps for the n-type region 201N and the p-type region 201P may be achieved using a photoresist and/or other masks (not shown). For example, a photoresist may be formed over the fins 103 and the isolation regions 105 in the n-type region 201N. The photoresist is patterned to expose the p-type region 201P of the substrate 101. The photoresist can be formed by using a spin-on technique and can be patterned using acceptable photolithography techniques. Once the photoresist is patterned, an n-type impurity implant is performed in the p-type region 201P, and the photoresist may act as a mask to substantially prevent n-type impurities from being implanted into the n-type region 201N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 201P, a photoresist is formed over the fins 103 and the isolation regions 105 in the p-type region 201P. The photoresist is patterned to expose the n-type region 201N of the substrate 101. The photoresist can be formed by using a spin-on technique and can be patterned using acceptable photolithography techniques. Once the photoresist is patterned, a p-type impurity implant may be performed in the n-type region 201N, and the photoresist may act as a mask to substantially prevent p-type impurities from being implanted into the p-type region 201P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 201N and the p-type region 201P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 6:
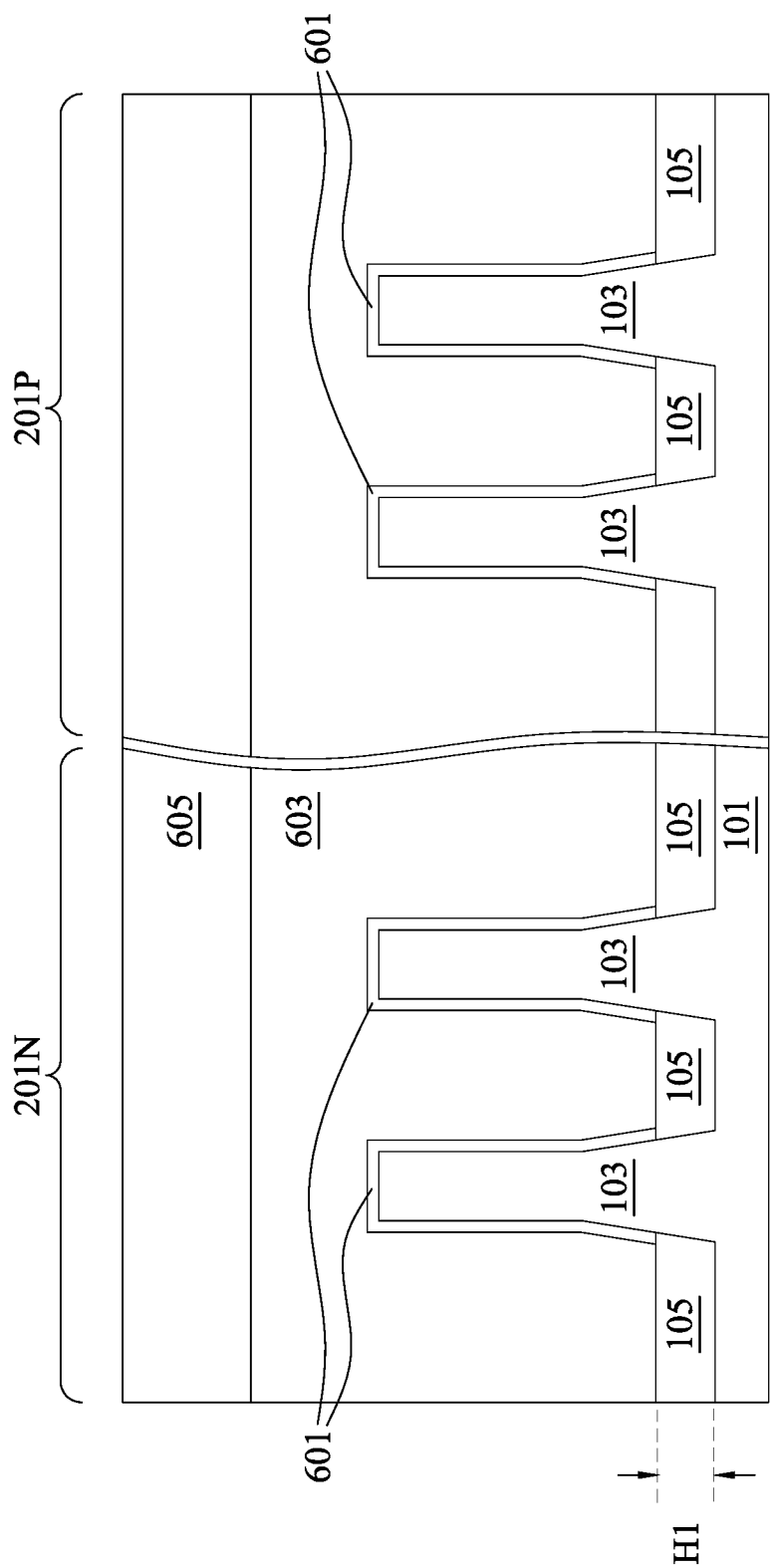
FIGS. 6 to 15B are cross-sectional views of further intermediate stages in the manufacturing of FinFETs, in accordance with some embodiments.

In FIG. 6, a dummy dielectric layer 601 is formed on the fins 103 after having formed the isolation regions 105 as described above. The dummy dielectric layer 601 may be, for example, silicon oxide, silicon nitride, a combination thereof, or the like, and may be deposited or thermally grown according to acceptable techniques. A dummy gate layer 603 is formed over the dummy dielectric layer 601, and a mask layer 605 is formed over the dummy gate layer 603. The dummy gate layer 603 may be deposited over the dummy dielectric layer 601 and then planarized, such as by a CMP. The mask layer 605 may be deposited over the dummy gate layer 603. The dummy gate layer 603 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 603 may be deposited by physical vapor deposition (PVD), CVD, sputter deposition, or other techniques for depositing the selected material. The dummy gate layer 603 may be made of other materials that have a high etching selectivity from the etching of adjacent materials, e.g., the isolation regions 105 and/or the dummy dielectric layer 601. The mask layer 605 may include one or more layers of, for example, silicon nitride, silicon oxynitride, or the like. In this example, a single dummy gate layer 603 and a single mask layer 605 are formed across the n-type region 201N and the p-type region 201P. It is noted that the dummy dielectric layer 601 is shown covering only the portions of the fins 103 that extend above the isolation regions 105 for illustrative purposes only. In some embodiments, the dummy dielectric layer 601 may be deposited such that the dummy dielectric layer 601 covers the portions of the fins 103 that extend above the isolation regions 105 and further covers the isolation regions 105. In such embodiments, the dummy dielectric layer 601 separates the dummy gate layer 603 from the fins 103 and the isolation regions 105.

FIGS. 7A through 15B illustrate various additional steps in the manufacturing of embodiment devices. FIGS. 7A through 15B illustrate features in either of the n-type region 201N and the p-type region 201P. For example, the structures illustrated in FIGS. 7A through 15B may be applicable to both the n-type region 201N and the p-type region 201P. Differences (if any) in the structures of the n-type region 201N and the p-type region 201P are described in the text accompanying each figure.

Figure 7B:
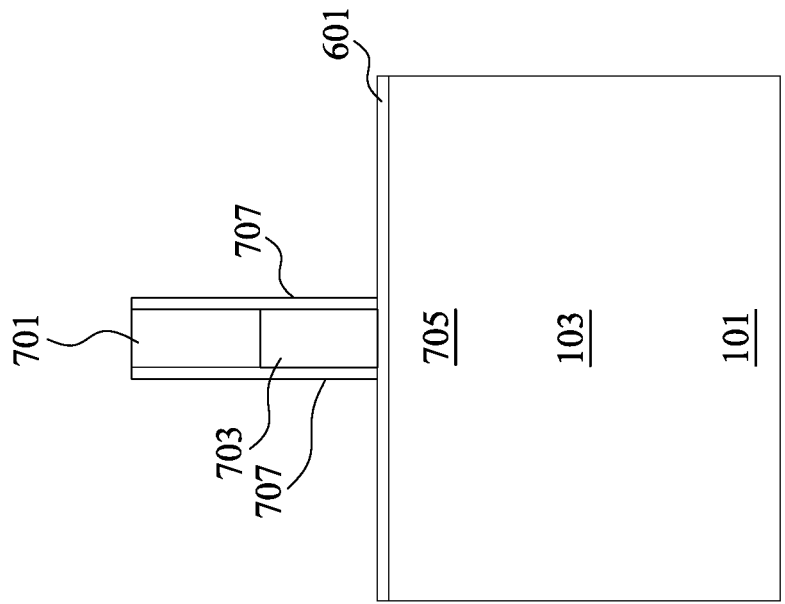
Figure 7A:
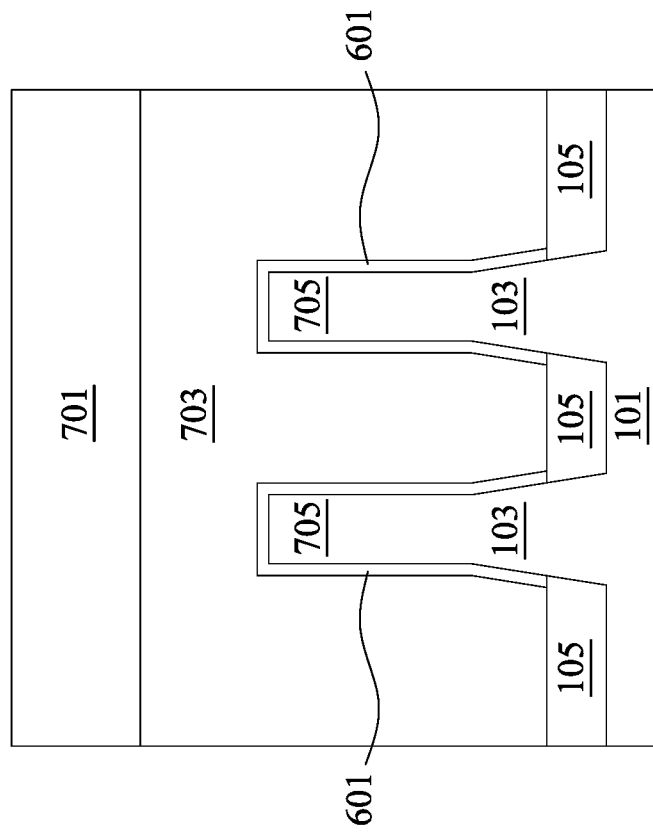

In FIGS. 7A and 7B, the mask layer 605 (see FIG. 6) may be patterned using acceptable photolithography and etching techniques to form masks 701. The pattern of the masks 701 then may be transferred to the dummy gate layer 603. In some embodiments (not illustrated), the pattern of the masks 701 may also be transferred to the dummy dielectric layer 601 by an acceptable etching technique to form dummy gates 703. The dummy gates 703 cover respective channel regions 705 of the fins 103. The pattern of the masks 701 may be used to physically separate each of the dummy gates 703 from adjacent dummy gates. The dummy gates 703 may also have a lengthwise direction substantially perpendicular to the lengthwise direction of respective fins 103.

Further in FIGS. 7A and 7B, gate seal spacers 707 can be formed on exposed surfaces of the dummy gates 703, the masks 701, and/or the fins 103. A thermal oxidation or a deposition followed by an anisotropic etch may form the gate seal spacers 707. The gate seal spacers 707 may be formed of silicon oxide, silicon nitride, silicon oxynitride, or the like.

After the formation of the gate seal spacers 707, implants for lightly doped source/drain (LDD) regions (not explicitly illustrated) may be performed. In the embodiments with different device types, similar to the implants discussed above, a mask, such as a photoresist, may be formed over the n-type region 201N, while exposing the p-type region 201P, and appropriate type (e.g., p-type) impurities may be implanted into the exposed fins 103 in the p-type region 201P. The mask may then be removed. Subsequently, a mask, such as a photoresist, may be formed over the p-type region 201P while exposing the n-type region 201N, and appropriate type impurities (e.g., n-type) may be implanted into the exposed fins 103 in the n-type region 201N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{19}$ $cm^{-3}$. An anneal process may be used to repair implant damage and to activate the implanted impurities.

Figure 8B:
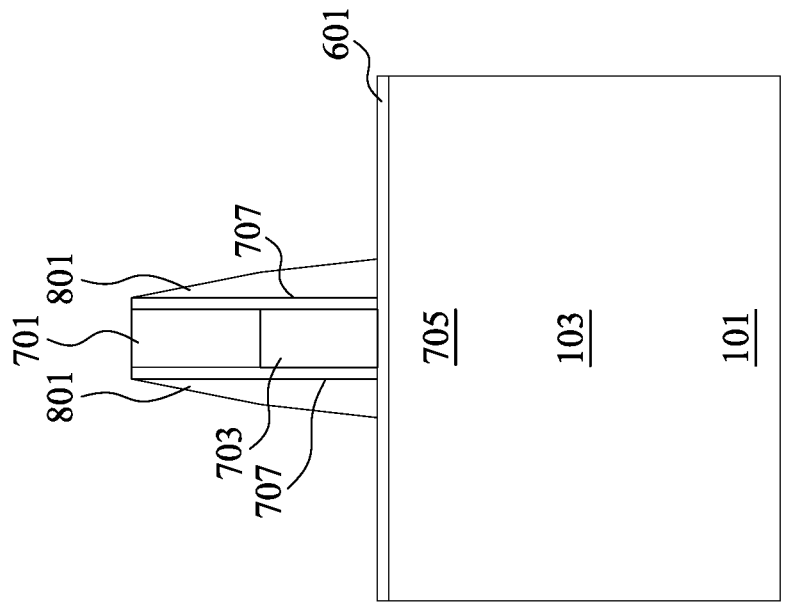
Figure 8A:
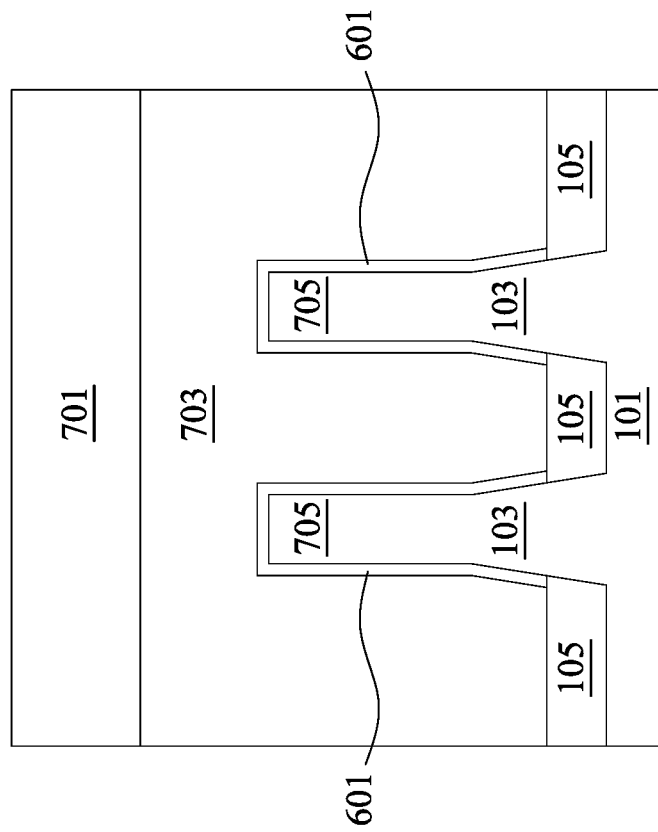

In FIGS. 8A and 8B, gate spacers 801 are formed on the gate seal spacers 707 along sidewalls of the dummy gates 703 and the masks 701. The gate spacers 801 may be formed by conformally depositing an insulating material and subsequently anisotropically etching the insulating material. The insulating material of the gate spacers 801 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 707 may be formed as "L-shaped" gate seal spacers by etching the gate seal spacers 707 after the deposition of the gate spacers 80i, spacers may be formed and removed, and/or the like). Furthermore, the n-type and p-type devices may be formed using a different structures and steps. For example, LDD regions for n-type devices may be formed prior to forming the gate seal spacers 707 while the LDD regions for p-type devices may be formed after forming the gate seal spacers 707.

Figure 9B:
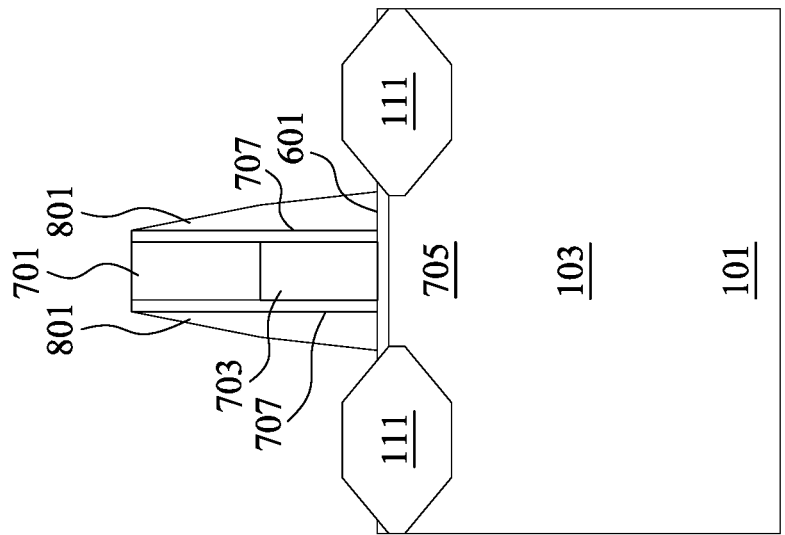
Figure 9A:
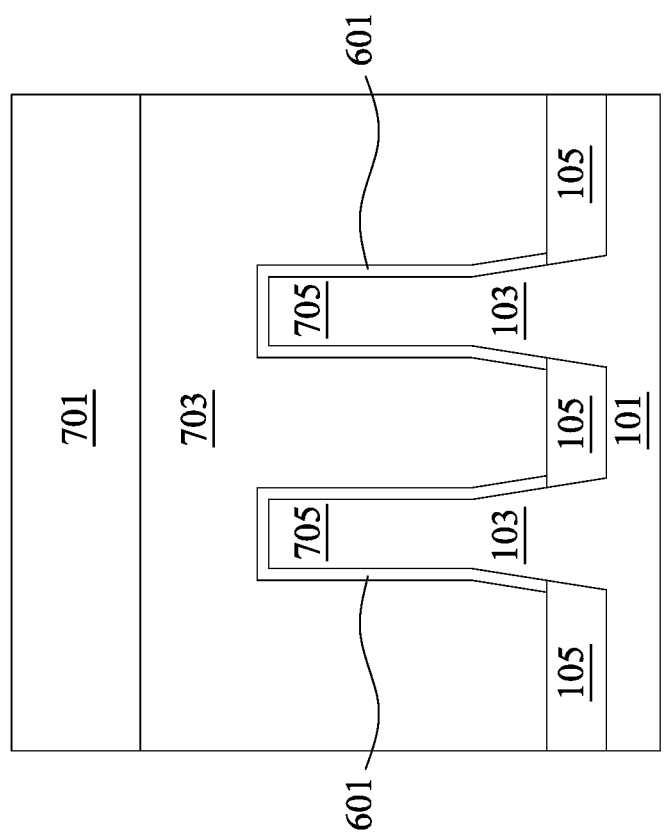
Figure 9D:
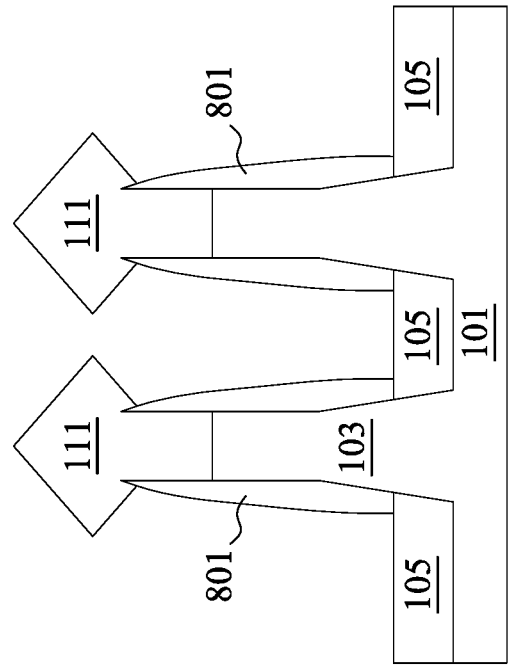
Figure 9C:
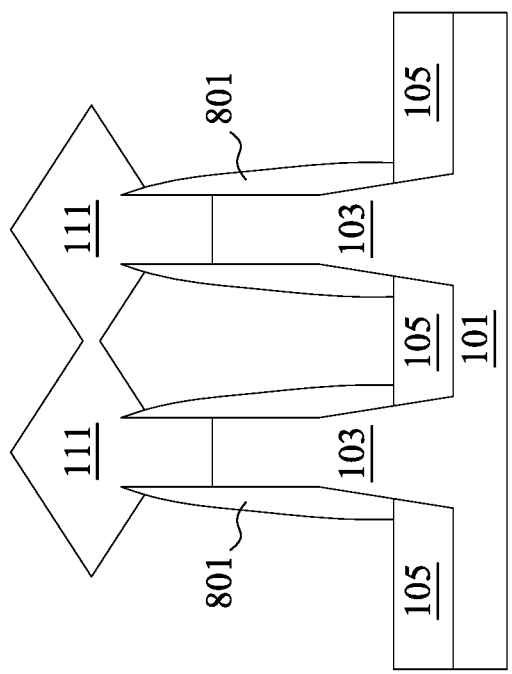

In FIGS. 9A and 9B, source/drain regions 111 are formed in the fins 103. The source/drain regions 111 are formed in the fins 103 such that each of the dummy gates 703 is disposed between respective neighboring pairs of the source/drain regions 111. In some embodiments the source/drain regions 111 may extend into, and may also penetrate through, the fins 103. In some embodiments, the gate spacers 801 are used to separate the source/drain regions 111 from the dummy gates 703 by an appropriate lateral distance so that the source/drain regions 111 do not short out subsequently formed gates of the resulting FinFETs. A material of the source/drain regions 111 may be selected to exert stress in the respective channel regions 705, thereby improving performance.

The source/drain regions 111 in the n-type region 201N may be formed by masking the p-type region 201P and etching source/drain regions of the fins 103 in the n-type region 201N to form recesses in the fins 103. Then, the source/drain regions 111 in the n-type region 201N are epitaxially grown in the recesses. The source/drain regions 111 may include any acceptable material, such as appropriate for n-type FinFETs. For example, if the fin 103 is silicon, the source/drain regions 111 in the n-type region 201N may include materials exerting a tensile strain in the channel region 705, such as silicon, silicon carbide, phosphorous doped silicon carbide, silicon phosphide, or the like. The source/drain regions 111 in the n-type region 201N may have surfaces raised from respective surfaces of the fins 103 and may have facets.

The source/drain regions 111 in the p-type region 201P may be formed by masking the n-type region 201N and etching source/drain regions of the fins 103 in the p-type region 201P to form recesses in the fins 103. Then, the source/drain regions 111 in the p-type region 201P are epitaxially grown in the recesses. The source/drain regions 111 may include any acceptable material, such as appropriate for p-type FinFETs. For example, if the fin 103 is silicon, the source/drain regions 111 in the p-type region 201P may comprise materials exerting a compressive strain in the channel region 705, such as silicon-germanium, boron doped silicon-germanium, germanium, germanium tin, or the like. The source/drain regions 111 in the p-type region 201P may have surfaces raised from respective surfaces of the fins 103 and may have facets.

The source/drain regions in and/or the fins 103 may be implanted with dopants to form source/drain regions, similar to the process previously discussed for forming lightly-doped source/drain regions, followed by an anneal. The source/drain regions 111 may have an impurity concentration of between about $10^{19}$ $cm^{-3}$ and about $10^{21}$ $cm^{-3}$. The n-type and/or p-type impurities for source/drain regions 111 may be any of the impurities previously discussed. In some embodiments, the source/drain regions 111 may be in situ doped during growth.

As a result of the epitaxy processes used to form the source/drain regions 111 in the n-type region 201N and the p-type region 201P, upper surfaces of the epitaxial source/drain regions have facets which expand laterally outward beyond sidewalls of the fins 103. In some embodiments, these facets cause adjacent ones of the source/drain regions 111 of a same FinFET to merge as illustrated by FIG. 9C. In other embodiments, adjacent ones of the source/drain regions 111 remain separated after the epitaxy process is completed as illustrated by FIG. 9D. In the embodiments illustrated in FIGS. 9C and 9D, gate spacers 801 are formed covering a portion of the sidewalls of the fins 103 that extend above the isolation regions 105 thereby blocking the epitaxial growth. In some other embodiments, the spacer etch used to form the gate spacers 801 may be adjusted to remove the spacer material to allow the epitaxially grown region to extend to the surface of the isolation regions 105.

Figure 10B:
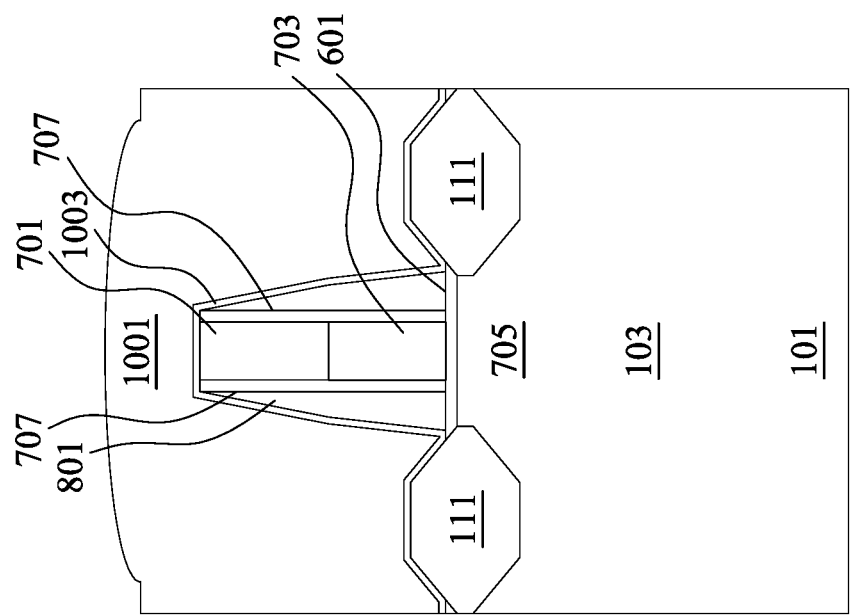
Figure 10A:
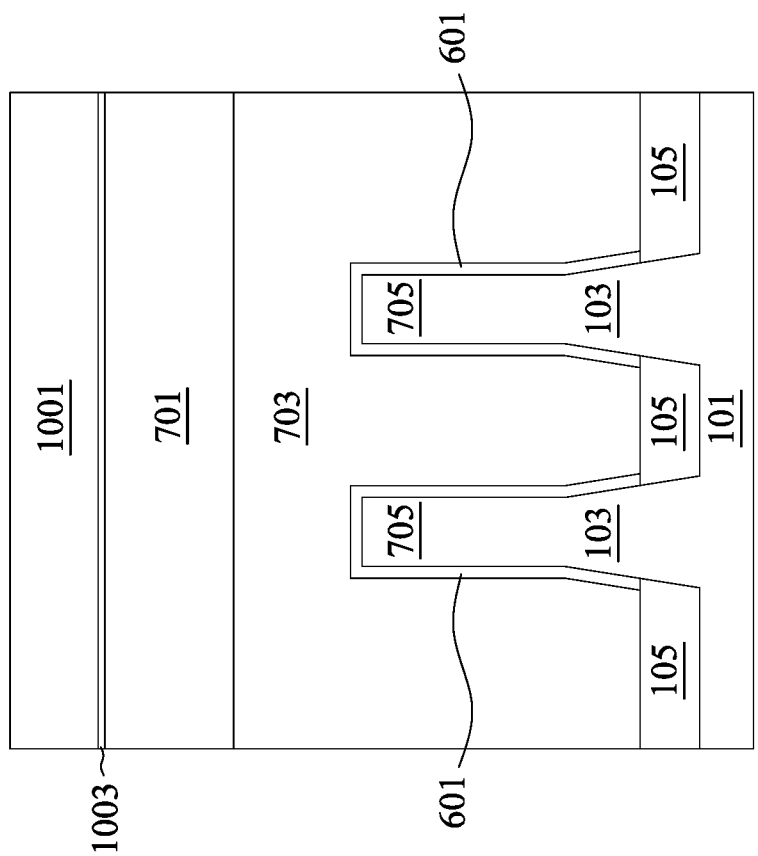

In FIGS. 10A and 10B, a first interlayer dielectric (ILD) 1001 is deposited over the structure illustrated in FIGS. 9A and 9B. The first ILD 1001 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 1003 is disposed between the first ILD 1001 and the source/drain regions 111, the masks 701, and the gate spacers 801. The CESL 1003 may comprise a dielectric material, such as, silicon nitride, silicon oxide, silicon oxynitride, or the like, having a lower etch rate than the material of the first ILD 1001 overlying the CESL 1003.

Figure 11B:
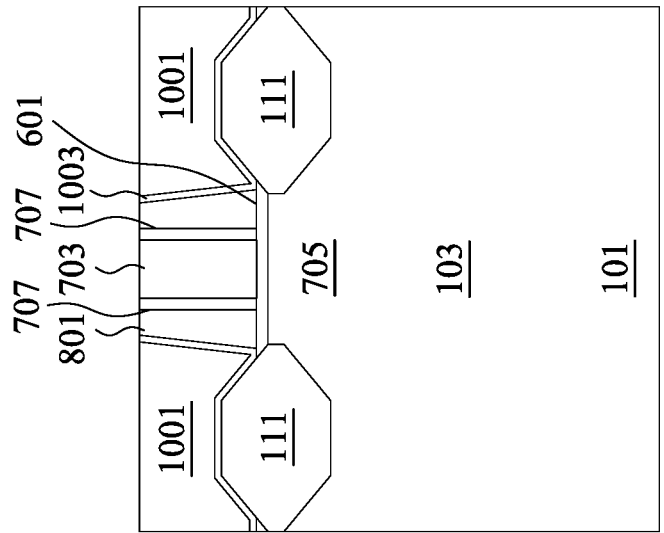
Figure 11A:
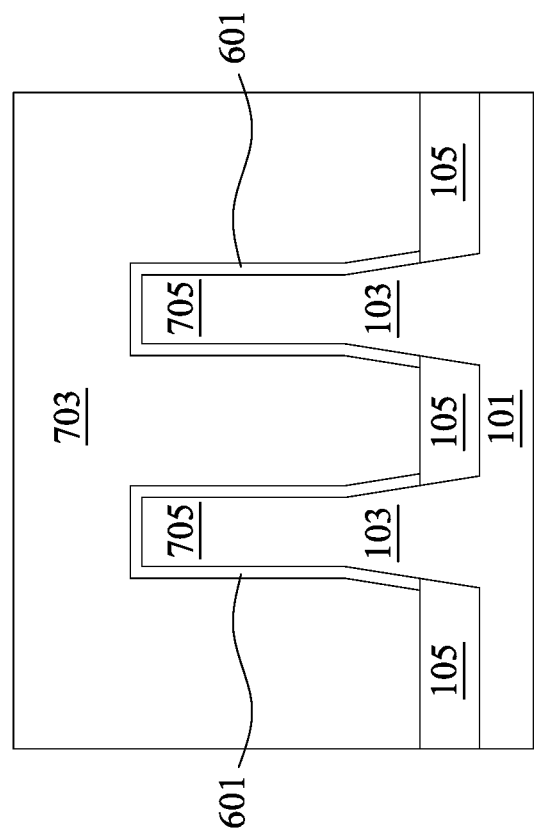

In FIGS. 11A and 11B, a planarization process, such as a CMP, may be performed to level the top surface of the first ILD 1001 with the top surfaces of the dummy gates 703 or the masks 701. The planarization process may also remove the masks 701 on the dummy gates 703, and portions of the gate seal spacers 707 and the gate spacers 801 along sidewalls of the masks 701. After the planarization process, top surfaces of the dummy gates 703, the gate seal spacers 707, the gate spacers 801, and the first ILD 1001 are level. Accordingly, the top surfaces of the dummy gates 703 are exposed through the first ILD 1001 and the CESL 1003. In some embodiments, the masks 701 may remain, in which case the planarization process levels the top surface of the first ILD 1001 with the top surfaces of the masks 701.

Figure 12B:
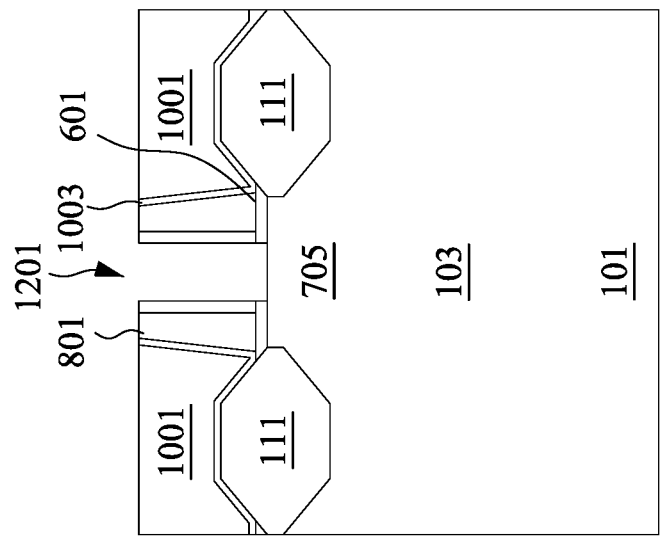
Figure 12A:
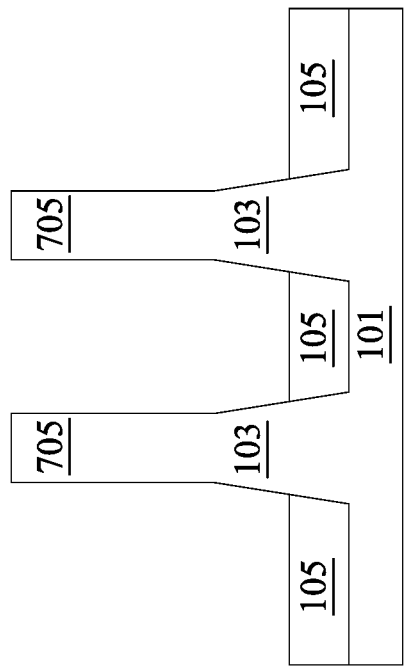

In FIGS. 12A and 12B, the dummy gates 703, and the masks 701 if present, are removed in an etching step(s), so that recesses 1201 are formed. Portions of the dummy dielectric layer 601 in the recesses 1201 may also be removed. In some embodiments, only the dummy gates 703 are removed and the dummy dielectric layer 601 remains and is exposed by the recesses 1201. In some embodiments, the dummy dielectric layer 601 is removed from recesses 1201 in a first region of a die (e.g., a core logic region) and remains in recesses 1201 in a second region of the die (e.g., an input/output region). In some embodiments, the dummy gates 703 are removed by an anisotropic dry etch process. For example, the etching process may include a dry etch process using reaction gas(es) that selectively etch the dummy gates 703 with little or no etching of the first ILD 1001, the CESL 1003, or the gate spacers 801. Each of the recess 1201 exposes and/or overlies a channel region 705 of a respective fin 103. Each channel region 705 is disposed between neighboring pairs of the source/drain regions 111. During the removal, the dummy dielectric layer 601 may be used as an etch stop layer when the dummy gates 703 are etched. The dummy dielectric layer 601 may then be optionally removed after the removal of the dummy gates 703.

Figure 13B:
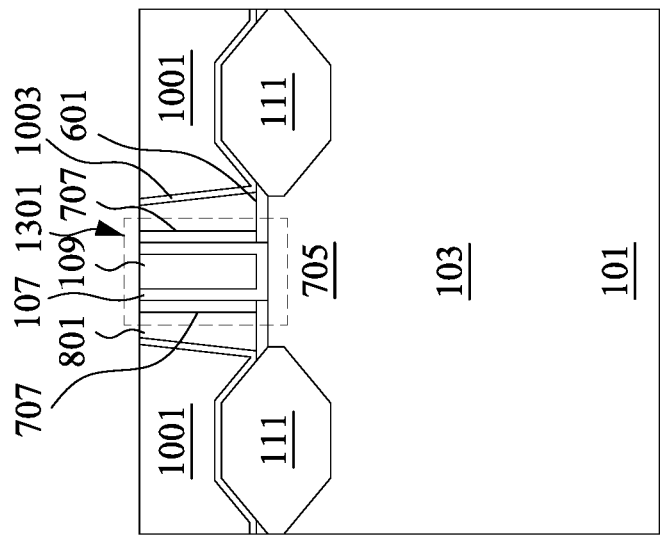
Figure 13A:
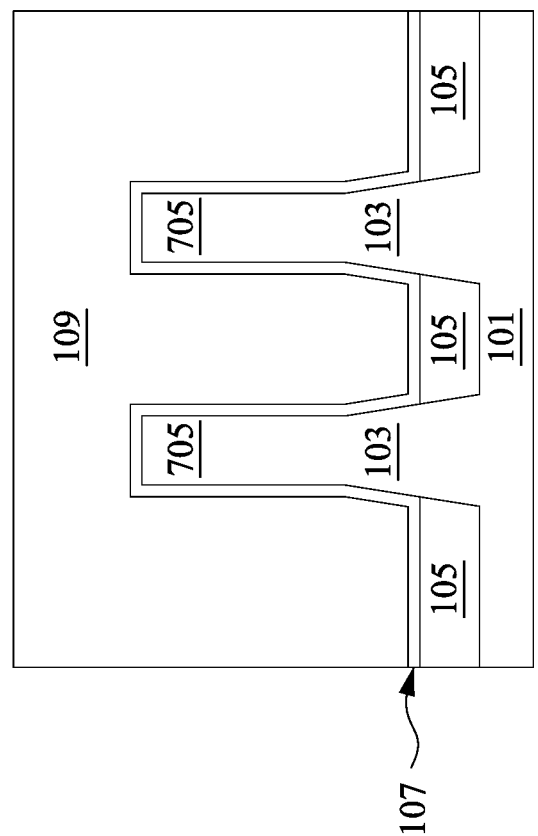

In FIGS. 13A and 13B, gate dielectric layers 107 and gate electrodes 109 are formed for replacement gates. FIG. 13C illustrates a detailed view of region 1301 of FIG. 13B. Gate dielectric layers 107 may be formed as one or more layers deposited over the top surfaces and along the sidewalls of the fins 103. The gate dielectric layers 107 may further be deposited within the recesses 1201 along sidewalls of the gate seal spacers 707 and/or gate spacers 801. The gate dielectric layers 107 may also be formed on the surfaces outside of the recesses 1201 over the top surfaces of the gate seal spacers 707, the gate spacers 801, the CESL 1003 and the first ILD 1001. In some embodiments, the gate dielectric layers 107 comprise one or more dielectric layers, such as one or more layers of silicon oxide, silicon nitride, metal oxide, metal silicate, or the like. For example, in some embodiments, the gate dielectric layers 107 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 107 may include a dielectric layer having a k value greater than about 7.0. The formation methods of the gate dielectric layers 107 may include Molecular-Beam Deposition (MBD), ALD, PECVD, and the like. In embodiments where portions of the dummy dielectric layer 601 remains in the recesses 1201, the gate dielectric layers 107 include a material of the dummy dielectric layer 601 (e.g., $SiO_2$).

The gate electrodes 109 are deposited over the gate dielectric layers 107, respectively, and fill the remaining portions of the recesses 1201. The gate electrodes 109 may include a metal-containing material such as titanium nitride, titanium oxide, tantalum nitride, tantalum carbide, cobalt, ruthenium, aluminum, tungsten, combinations thereof, or multi-layers thereof. For example, although a single layer is illustrated for the gate electrode 109 in FIG. 13B, the gate electrode 109 may comprise any number of liner layers 109A, any number of work function tuning layers 109B, and a fill material 109C as illustrated by FIG. 13C. After the filling of the recesses 1201, a planarization process, such as a CMP, may be performed to remove the excess portions of the gate dielectric layers 107 and the material of the gate electrodes 109, which excess portions are over the top surface of the first ILD 1001. The remaining portions of material of the gate electrodes 109 and the gate dielectric layers 107 thus form replacement gates of the resulting FinFETs. The gate electrodes 109 and the gate dielectric layers 107 may be collectively referred to as a "gate stack." The gate and the gate stacks may extend along sidewalls of a channel region 705 of the fins 103.

The formation of the gate dielectric layers 107 in the n-type region 201N and the p-type region 201P may occur simultaneously such that the gate dielectric layers 107 in each region are formed from the same materials, and the formation of the gate electrodes 109 may occur simultaneously such that the gate electrodes 109 in each region are formed from the same materials. In some embodiments, the gate dielectric layers 107 in each region may be formed by distinct processes, such that the gate dielectric layers 107 may be different materials, and/or the gate electrodes 109 in each region may be formed by distinct processes, such that the gate electrodes 109 may be different materials. Various masking steps may be used to mask and expose appropriate regions when using distinct processes.

Figure 14B:
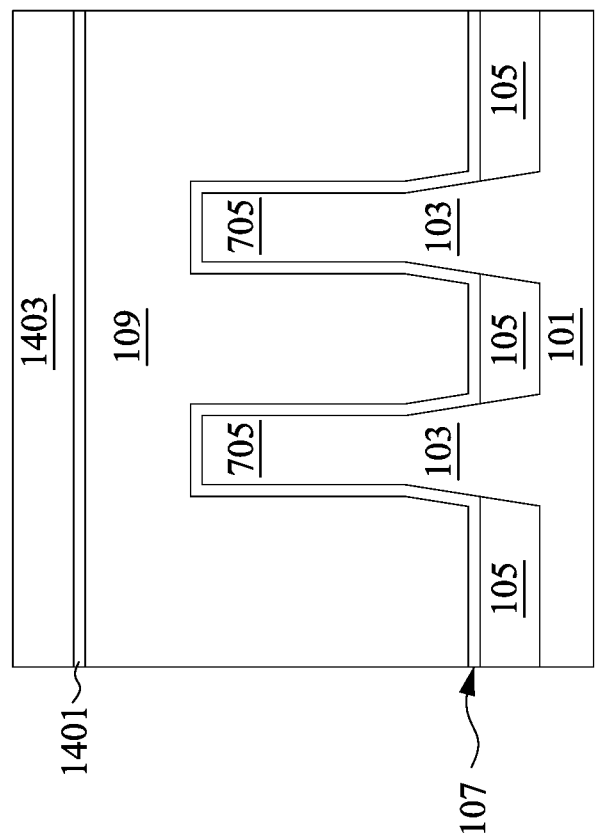
Figure 14A:
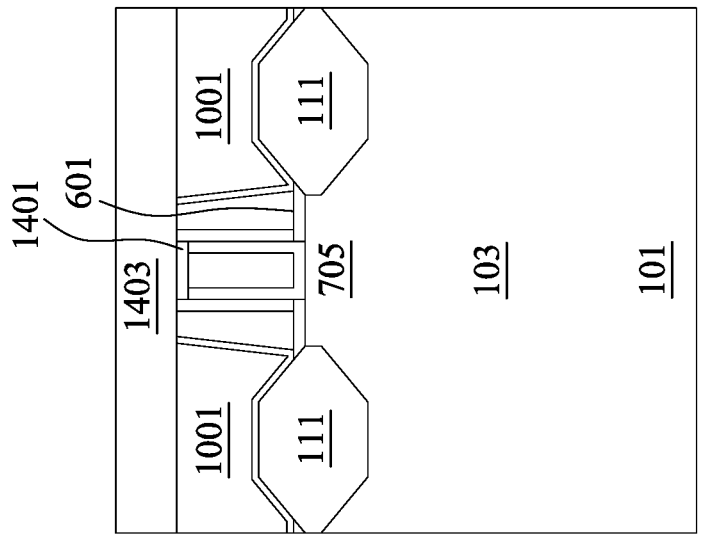

In FIGS. 14A and 14B, a gate mask 1401 is formed over the gate stack (including a gate dielectric layer 107 and a corresponding gate electrode 109), and the gate mask 1401 may be disposed between opposing portions of the gate spacers 801. In some embodiments, forming the gate mask 1401 includes recessing the gate stack so that a recess is formed directly over the gate stack and between opposing portions of gate spacers 801. A gate mask 1401 comprising one or more layers of dielectric material, such as silicon nitride, silicon oxynitride, or the like, is filled in the recess, followed by a planarization process to remove excess portions of the dielectric material extending outside of the recess and over the planar surface of the first ILD 1001.

As also illustrated in FIGS. 14A and 14B, a second ILD 1403 is deposited over the first ILD 1001. In some embodiments, the second ILD 1403 is a flowable film formed by a flowable CVD method. In some embodiments, the second ILD 1403 is formed of a dielectric material such as PSG, BSG, BPSG, USG, or the like, and may be deposited by any suitable method, such as CVD and PECVD. The subsequently formed gate contacts 1501 (FIGS. 15A and 15B) penetrate through the second ILD 1403 and the gate mask 1401 to contact the top surface of the recessed gate electrode 109.

Figure 15B:
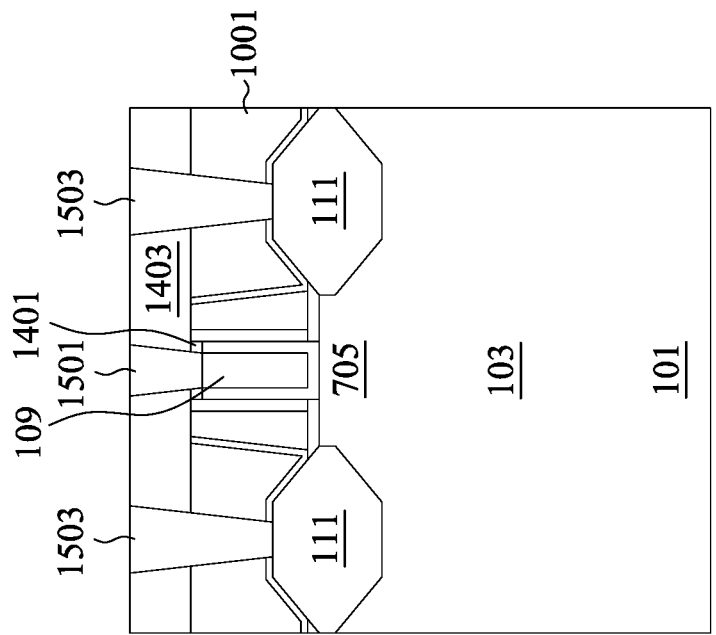
Figure 15A:
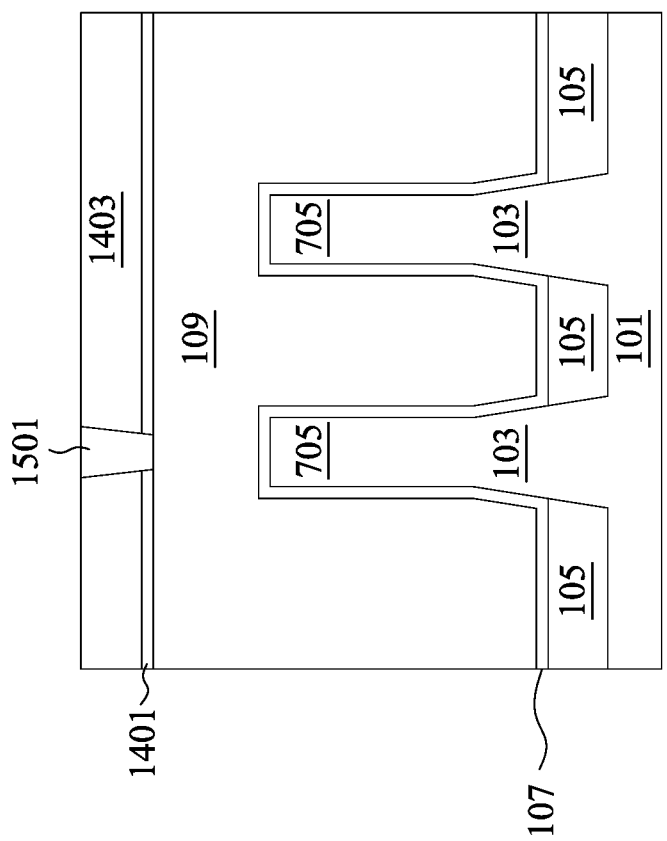

In FIGS. 15A and 15B, gate contacts 1501 and source/drain contacts 1503 are formed through the second ILD 1403 and the first ILD 1001 in accordance with some embodiments. Openings for the source/drain contacts 1503 are formed through the first ILD 1001 and the second ILD 1403, and openings for the gate contact 1501 are formed through the second ILD 1403 and the gate mask 1401. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 1403. The remaining liner and conductive material form the source/drain contacts 1503 and gate contacts 1501 in the openings. An anneal process may be performed to form a silicide at the interface between the source/drain regions 111 and the source/drain contacts 1503. The source/drain contacts 1503 are physically and electrically coupled to the source/drain regions 111, and the gate contacts 1501 are physically and electrically coupled to the gate electrodes 109. The source/drain contacts 1503 and gate contacts 1501 may be formed in different processes, or may be formed in the same process. Although shown as being formed in the same cross-sections, it should be appreciated that each of the source/drain contacts 1503 and gate contacts 1501 may be formed in different cross-sections, which may avoid shorting of the contacts.

In accordance with still other embodiments, FIGS. 16A-16F illustrate a second gap-fill ALD process 1600. For example, the second gap-fill ALD process 1600 may be used to form a second gap-fill material 1603 in the trenches 301 of FIG. 3 in the eventual formation of the isolation regions 105 according to still other embodiments. The second gap-fill ALD process 1600 is similar to the first gap-fill ALD process 400 illustrated in FIGS. 5A-5F; however, the second gap-fill ALD process 1600 uses a third precursor to form a third monolayer 1601 over the fins 103 to form a thin layer build-up of a second gap-fill material 1603 instead of using the deposition of the second precursor over the first monolayer 501 to form the first gap-fill material 401. The thin layer build-up is formed from the deposition of the third monolayers 1601 one over the other, in accordance with some embodiments. In a particular embodiment, the second gap-fill material 1603 may be used in a void-less and seamless deposition of a dielectric film (e.g., silicon (Si)) in the eventual formation of the isolation regions 105. Once the desired thickness of thin layer build-up of the second gap-fill material 1603 has been reached the optional anneal process and/or optional treatment (e.g., oxidation treatment, nitridation treatment, densification treatment, or the like) may be performed on the second gap-fill material 1603 to form the isolation regions 105. However, the second gap-fill ALD process 1600 and the second gap-fill material 1603 may be used in deposition of a dielectric film in any gap in the eventual formation of a void-less and seamless structure within the gap. For example, once the isolation regions 105 have been formed, the second gap-fill ALD process 1600 may be used in the formation of the dummy gate layer 603 within gaps between the dummy dielectric layers 601 and over the isolation regions 105, as described above.

Although the embodiments of the second gap-fill process 1600 are directed towards forming the second gap-fill material 1603 in the eventual formation of the isolation regions 105 and/or in the eventual formation of the dummy gate layer 603, the second gap-fill process 1600 may be utilized to fill still other gaps in the eventual formation of other structures. The second gap-fill process 1600 may be used to fill any target gap in which the third monolayer 1601 reacts in a self-limiting reaction with the material in which the thin layer build-up of the second gap-fill material 1603 is formed within the target gap, the thin layer build-up being formed from the deposition of the third monolayers 1601 one over the other. Examples of other structures that may be formed using the second gap-fill process 1600 include, but are not limited to, structures such as dummy gate electrodes, gate spacers, top spacers, bottom spacers, dummy masks, source/drain regions, gate contacts, source/drain contacts, dielectric plugs, or the like.

FIG. 16A illustrates a deposition of the third monolayer 1601 formed over the fins 103 and within the trenches 301. According to some embodiments the deposition and etching system 405 uses a third precursor material to deposit the third monolayer 1601 onto the fin 103 and within the trenches 301.

According to some embodiments, the third monolayer 1601 may be formed as a thin film (e.g., silane, dichlorosilane (DCS), or the like) similar to the formation of the first monolayer 501 as set forth above with regard to FIG. 5A. As such, silane may be placed within the first precursor delivery system 407.

In some embodiments, the deposition and etching system 405 uses a second etching precursor to etch the third monolayer 1601. The second etching precursor may be any of the etching precursor materials that are suitable for the first etching precursor set forth above with regard to FIG. 5B. In the present embodiment, hydrogen ($H_2$) plasma is used as the second etching material for partially etching the third monolayer 1601. As such, hydrogen ($H_2$) is placed within the etching precursor delivery system 409.

Once the third precursor material and the second etching precursor have been placed into the first precursor delivery system 407 and the etching precursor delivery system 409 respectively, the formation of the second gap-fill material 1603 may be initiated by the control unit 421 sending an instruction to the precursor gas controller 419 to connect the first precursor delivery system 407 to the deposition and etching chamber 413. Once connected, the first precursor delivery system 407 can deliver the third precursor material (e.g., silane) to the showerhead 425 through the precursor gas controller 419 and the manifold 423. The showerhead 425 can then disperse the third precursor material into the deposition and etching chamber 413. According to some embodiments, the third precursor material may be flowed into the deposition and etching chamber 413 using any suitable process conditions for depositing such a material, wherein the third precursor material can be adsorbed and react to the exposed surfaces of the substrate 101 and the fins 103. As such, a monolayer of the reacted third precursor material is formed in a reaction on the surface of the substrate 101 and the fins 103, thereby allowing for a more precise control of the thickness of the third monolayer 1601.

After the third monolayer 1601 has been formed, the deposition and etching chamber 413 may be purged of the third precursor material using the precursor gas controller 419 and/or the vacuum pump 433, as discussed above, to aid in the removal of the third precursor material. The purge gas, along with the vacuum pump 433, may purge the third precursor material from the deposition and etching chamber 413 for about 3 seconds. However, any suitable time may be used.

Figure 16B:
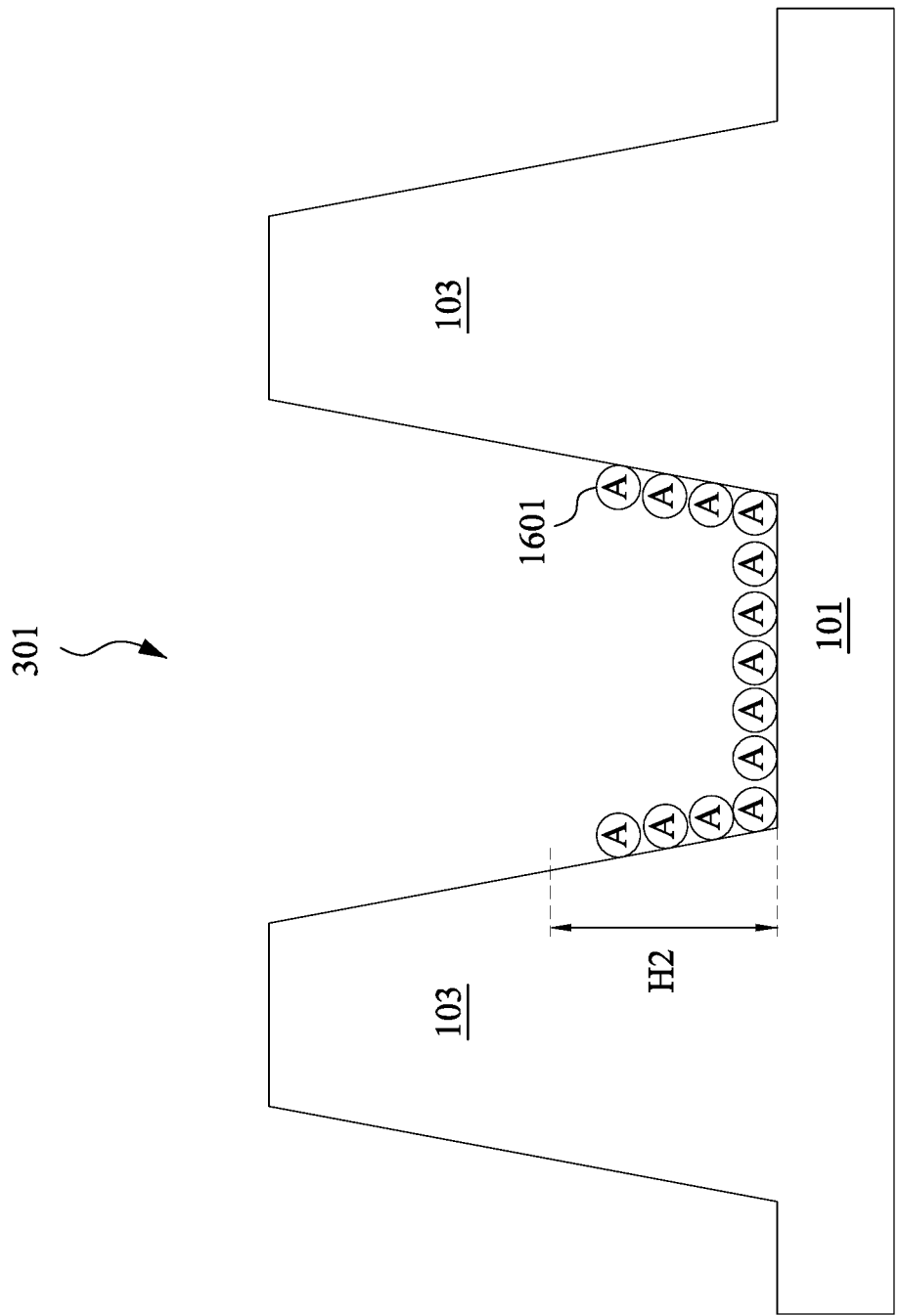

Turning to FIG. 16B, after the purge of the third precursor material has been completed, the introduction of the second etching precursor (e.g., $H_2$ plasma) to the deposition and etching chamber 413 may be initiated by the control unit 421 sending an instruction to the precursor gas controller 419 to disconnect the purge gas delivery system 435 and to connect the etching precursor delivery system 409 (containing the second etching precursor) to the deposition and etching chamber 413. Once connected, the etching precursor delivery system 409 can deliver the second etching precursor to the showerhead 425. The showerhead 425 can then disperse the second etching precursor (e.g., $H_2$ plasma) into the deposition and etching chamber 413, wherein the second etching precursor can be used to partially etch the third monolayer 1601.

According to some embodiments, the second etching precursor may be flowed into the deposition and etching chamber 413 using any suitable process conditions for etching such a material as the third monolayer 1601, wherein the second etching precursor can react to the exposed surfaces of the third monolayer 1601. According to some embodiments, the third monolayer 1601 may be partially etched to a level at or below a desired height (e.g., second height H2 of between about 20 nm and about 50 nm) above the bottom of the trenches 301. According to some embodiments, the partial etch is a dry etch or a plasma etch and is timed to stop at the desired height within the trenches 301. However, any suitable etching process times and/or process conditions may be used. As such, the non-consumed portion of the third monolayer 1601 remains at the bottom of the trenches 301. In particular embodiments in which the second gap-fill material 1603 is eventually formed into the isolation regions 105, the second height H2 may be a desired height of the isolation regions 105 of between about 20 nm and about 50 nm. However, any suitable height may be used. As such, the surfaces of the fins 103 are exposed above the second height H2 by the partial etching of the third monolayer 1601.

After the partial etching of the third monolayer 1601 has finished, the deposition and etching chamber 413 may be purged of the second etching precursor. For example, the control unit 421 may instruct the precursor gas controller 419 to disconnect the etching precursor delivery system 409 (containing the second etching precursor to be purged from the deposition and etching chamber 413) and to connect the purge gas delivery system 435 to deliver the purge gas to the deposition and etching chamber 413. Additionally, the control unit 421 may also initiate the vacuum pump 433 in order to apply a pressure differential to the deposition and etching chamber 413 to aid in the removal of the second etching precursor. The purge gas, along with the vacuum pump 433, may purge the second etching precursor from the deposition and etching chamber 413 for about 3 seconds. However, any suitable time may be used.

Figure 16C:
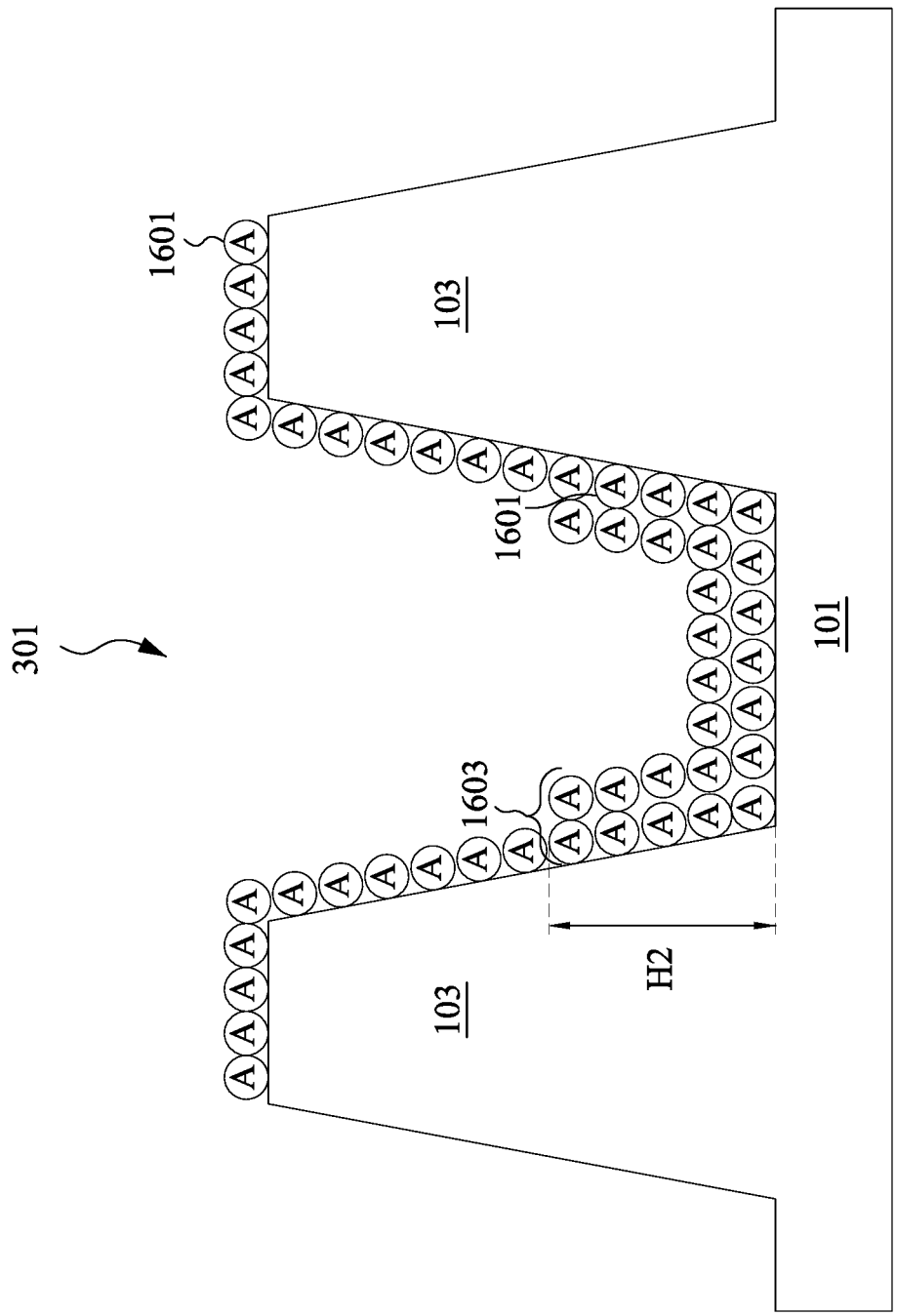

Turning to FIG. 16C, after the purge of the second etching precursor has been completed, the third precursor material may be re-introduced to the deposition and etching chamber 413 by the control unit 421 sending an instruction to the precursor gas controller 419 to disconnect the purge gas delivery system 435 and to re-connect the first precursor delivery system 407 (containing the third precursor material) to the deposition and etching chamber 413. Once connected, the first precursor delivery system 407 can deliver the third precursor material to the showerhead 425. The showerhead 425 can then disperse the third precursor material into the deposition and etching chamber 413, wherein the third precursor material can be used to form another layer of the third monolayer 1601 over the non-consumed portion of the third monolayer 1601 and over the exposed portions of the fins 103.

Once connected, the third precursor material may be flowed into the deposition and etching chamber 413, wherein the third precursor material can be adsorbed and react in another reaction on the exposed surfaces of the non-consumed portion of the third monolayer 1601 and the fins 103 to form a subsequent thin film of the third monolayer 1601. As such, a build-up of the second gap-fill material 1603 (e.g., silicon (Si)) is formed within the trenches 301. After the subsequent thin film of the third monolayer 1601 has been formed, the deposition and etching chamber 413 may be purged of the third precursor material, as discussed above.

Figure 16D:
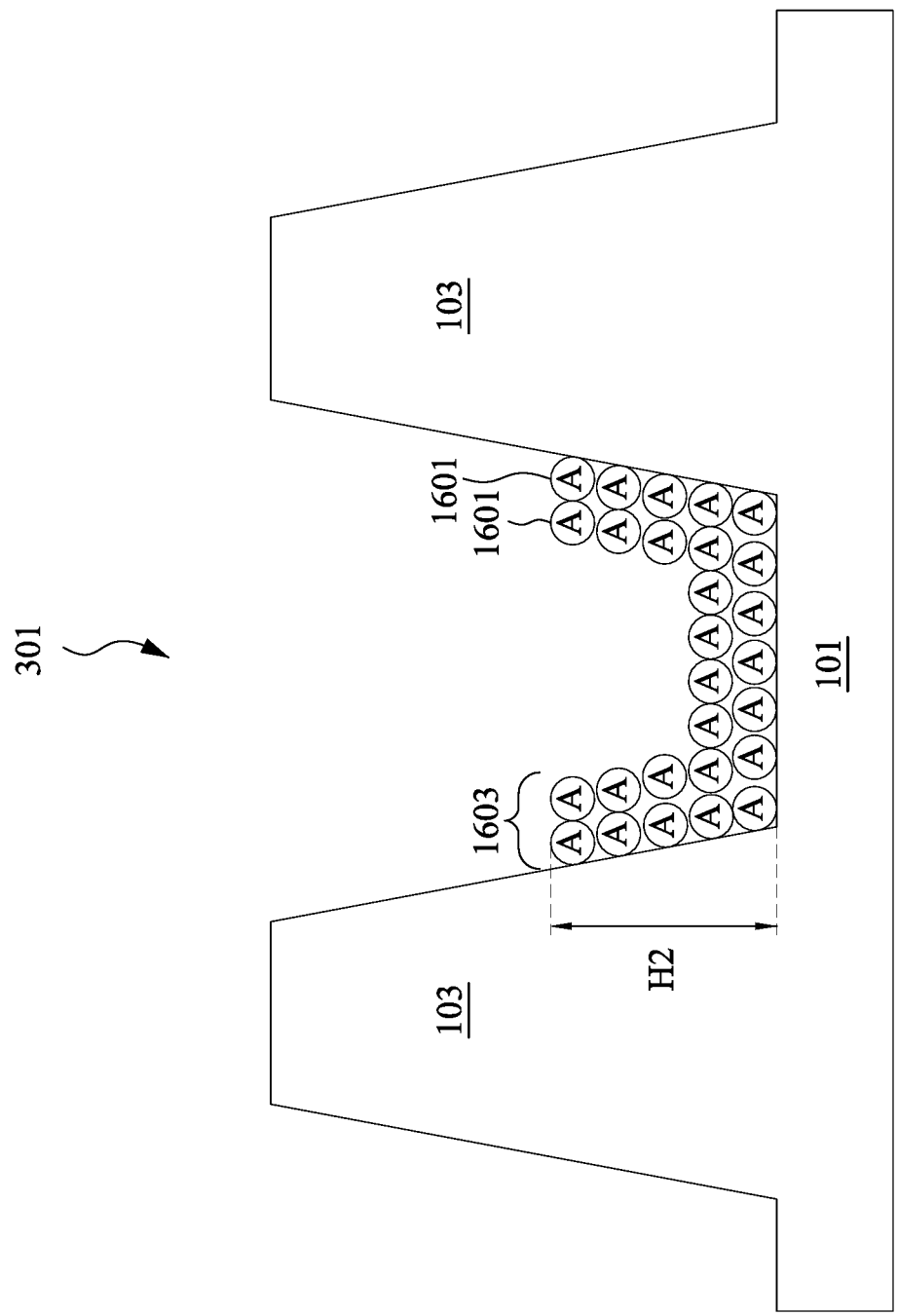

Turning to FIG. 16D, after the purge of the third precursor material has been completed, the second etching precursor (e.g., $H_2$ plasma) may be re-introduced to the deposition and etching chamber 413 via the etching precursor delivery system 409, as discussed above. Once the etching precursor delivery system 409 has been re-connected, the second etching precursor can be dispensed by the showerhead 425 into the deposition and etching chamber 413, wherein the second etching precursor is used to partially etch the subsequent thin film of the third monolayer 1601 to the second height H2. Once the partial etching of the subsequent thin film of the third monolayer 1601 has finished, the deposition and etching chamber 413 may be purged of the second etching precursor, as discussed above.

Continuing to FIG. 16E, after the purge of the second etching precursor has been completed, yet another thin layer of the third monolayer 1601 may be formed over the non-consumed portions of the third monolayer 1601 to add to the build-up of the second gap-fill material 1603 (e.g., silicon (Si)). The yet another thin layer of the third monolayer 1601 may be formed to add to the build-up of the second gap-fill material 1603 by performing another cycle of the third precursor material (e.g., dichlorosilane (DCS)) deposition and reaction, purging the deposition and etching chamber 413 of the third precursor material, subsequent partial etching using the second etching precursor (e.g., $H_2$ plasma), and purging of the second etching precursor, as described above.

Figure 16F:
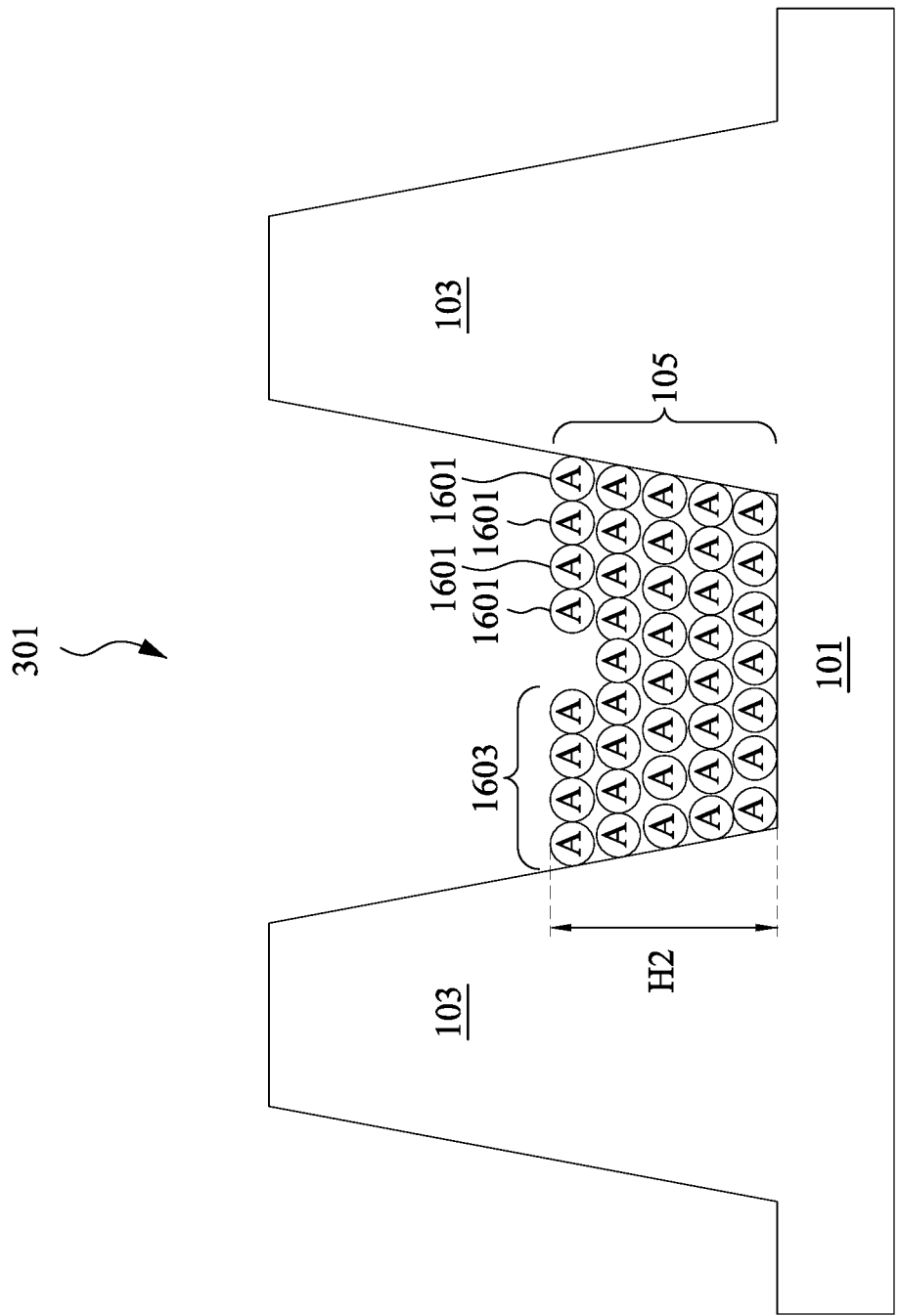

With reference now to FIG. 16F, after the purge of the second etching precursor has been completed, still a further thin layer of the third monolayer 1601 may be formed over the non-consumed portions of the third monolayer 1601 to add even further to the build-up of the second gap-fill material 1603 (e.g., silicon (Si)). The still further thin layer of the third monolayer 1601 may be formed to add to the build-up of the second gap-fill material 1603 by performing still a further cycle of the third precursor material deposition and reaction, purging the deposition and etching chamber 413 of the third precursor material, subsequent partial etching using the second etching precursor (e.g., $H_2$ plasma), and purging of the second etching precursor, as described above.

Further cycles may be repeated in the manner disclosed above to continue to fill the trenches 301 in a void-less and seamless deposition of the second gap-fill material 1603. These cycles may be repeated until the second gap-fill material 1603 fills the area of the trenches 301 to the desired thickness (e.g., the second height H2). However, other desirable thicknesses of the second gap-fill material 1603, including filling and/or overfilling the trenches 301, may be achieved by performing more cycles or less cycles. According to some embodiments, once the desired thickness of the second gap-fill material 1603 has been reached an optional anneal process and/or optional treatment (e.g., oxidation treatment, densification treatment, or the like) may be performed on the second gap-fill material 1603 to form the isolation regions 105. Once the isolation regions 105 have been formed, the substrate 101 may be removed from the deposition and etching chamber 413 for further processing.

According to the embodiments disclosed herein, semiconductor devices such as FinFET devices may be formed using the methods and system described herein. In particular, the embodiments disclose methods and a system for forming dielectric materials within trenches and may have one or more of the following advantages and/or benefits. The disclosed methods of depositing a first precursor material in a self-limiting reaction with the materials of exposed surfaces along sidewalls and at a bottom of a trench allow for the precise control of deposition of the first precursor material. Etching of the first precursor materials from the upper portion of the trench allow for a precise deposition of a second precursor material in a self-limiting reaction between the first precursor material and the second precursor material to form monolayers of the desired dielectric material within the trench. Furthermore, the formation of these monolayers enables for the selective deposition of a dielectric film on target surfaces with an arbitrary thickness. As such, the formation of a dielectric structure may be formed in a seamless and void-less manner in a bottom-up process that is scalable to very small trenches, for example, trenches having aspect ratios of between about 5:1 and about 20:1. Furthermore, these methods of deposition allow for precise deposition and control of the gap-fill materials to be seamless and void-less even within trenches comprising an overhang structure or a tilted configuration. As such, improved device performance and production yields are achieved.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In an embodiment, a method includes: introducing a first precursor into a trench such that portions of the first precursor react with sidewalls of the trench to form a first precursor product; etching the first precursor product to expose upper portions of the sidewalls of the trench; and introducing a second precursor into the trench, such that portions of the second precursor react with the first precursor product. In an embodiment the first precursor comprises silane. In an embodiment etching the first precursor product uses hydrogen plasma. In an embodiment the second precursor comprises ammonia. In an embodiment the second precursor is the same as the first precursor. In an embodiment the first precursor comprises a metal. In an embodiment the trench is located within a dielectric material.

In another embodiment, a method includes: forming a first precursor layer along exposed surfaces within a gap in a self-limiting reaction between a first precursor and the exposed surfaces; re-exposing a portion of the surfaces within upper portions of the gap by partially etching the first precursor layer; and forming a second precursor layer along a remaining portion of the first precursor layer. In an embodiment the forming the second precursor layer comprises forming a monolayer of a second material in a self-limiting reaction between the first precursor layer and a second precursor. In an embodiment the monolayer of the second material comprises silicon. In an embodiment the monolayer of the second material comprises a metal. In an embodiment the forming the second precursor layer further comprises forming the second precursor layer along the re-exposed surfaces within the gap. In an embodiment the second precursor layer is the same as the first precursor layer. In an embodiment the etching the first precursor layer comprises using a hydrogen plasma. In an embodiment the forming the first precursor layer comprises forming a first silicon layer.

In yet another embodiment, a method includes: forming a trench within a first material; forming a first monolayer of a first precursor material along sidewalls and at a bottom of the trench; partially removing the first monolayer along upper portions of the sidewalls of the trench; and forming a second monolayer of a second precursor material over a remaining portion of the first monolayer within the trench. In an embodiment the forming the first monolayer comprises forming a first film layer within the trench in a self-limiting reaction. In an embodiment the partially removing the first monolayer comprises using a halide gas. In an embodiment the forming the second monolayer comprises forming a second film layer in a second self-limiting reaction. In an embodiment the forming the second monolayer comprises forming a second film layer over the first film layer, the second film layer and the first film layer comprising a same material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing a material layer in a trench by performing a plurality of deposition cycles until the material layer completely fills the trench, wherein after the material layer completely fills the trench, the material layer is free of any voids disposed therein, and wherein a first deposition cycle of the plurality of deposition cycles comprises:
introducing a first precursor into the trench such that portions of the first precursor react with sidewalls and a bottom surface of the trench to form a first precursor product;
etching the first precursor product to expose upper portions of the sidewalls of the trench, wherein the etching leaves the first precursor product on the bottom surface of the trench intact, and wherein the etching utilizes a chemical reaction; and
introducing a second precursor into the trench, such that portions of the second precursor react with the first precursor product to from a material layer on the bottom surface and lower portions of the sidewalls of the trench, wherein the second precursor does not react with the upper portions of the sidewalls of the trench that have been exposed by etching the first precursor product such that the material layer is not formed on the upper portions of the sidewalls of the trench.

2. The method of claim 1, wherein the first precursor comprises silane.

3. The method of claim 2, wherein etching the first precursor product uses a hydrogen plasma.

4. The method of claim 3, wherein the second precursor comprises ammonia.

5. The method of claim 3, wherein the second precursor is the same as the first precursor.

6. The method of claim 1, wherein the first precursor comprises a metal.

7. The method of claim 1, wherein the trench is located within a dielectric material.

8. A method comprising:
forming a first precursor layer along exposed surfaces within a gap in a self-limiting reaction between a first precursor and the exposed surfaces, wherein the first precursor layer is entirely chemically attached to the exposed surfaces within the gap, and wherein the first precursor layer has a same chemical composition as the first precursor;
re-exposing a portion of the surfaces within upper portions of the gap by partially etching the first precursor layer that has the same chemical composition as the first precursor, wherein a bottom surface of the gap remains covered by the first precursor layer after the first precursor layer is partially etched; and
forming a second precursor layer directly on a remaining portion of the first precursor layer, wherein forming the second precursor layer comprises flowing a second precursor on exposed surfaces of the remaining portion of the first precursor layer, and wherein the second precursor and the second precursor layer has a same chemical composition as the first precursor.

9. The method of claim 8, wherein the forming the second precursor layer comprises forming a monolayer of a second material in a self-limiting reaction between the first precursor layer and a second precursor.

10. The method of claim 9, wherein the monolayer of the second material comprises silicon.

11. The method of claim 9, wherein the monolayer of the second material comprises a metal.

12. The method of claim 8, wherein the forming the second precursor layer further comprises forming the second precursor layer along the re-exposed surfaces within the gap.

13. The method of claim 8, wherein the etching the first precursor layer comprises using a hydrogen plasma.

14. The method of claim 13, wherein the forming the first precursor layer comprises forming a first silicon layer.

15. The method of claim 8, wherein forming the first precursor layer, partially etching the first precursor layer, and forming the second precursor layer is a first cycle of a deposition process to deposit a first material in the gap, wherein the deposition process further comprises performing a plurality of additional cycles until the gap is filled with a material layer, wherein each of the plurality of additional cycles comprises repeating forming the first precursor layer and forming the second precursor layer, and wherein the material layer is free of voids disposed therein after the deposition process.

16. The method of claim 8, further comprising re-exposing the portion of the surfaces within upper portions of the gap by partially etching the second precursor layer, wherein a bottom surface of the gap remains covered by the first precursor layer and the second precursor layer after the second precursor layer is partially etched.

17. A method comprising:
forming a trench within a first material on a first substrate;
placing the first substrate in a deposition chamber
while the first substrate is in the deposition chamber, depositing a second material in the trench, wherein the second material only partially fills the trench, wherein depositing the second material comprises:
forming a first monolayer of a first precursor material along sidewalls and at a bottom of the trench by flowing the first precursor material into the trench, wherein the first precursor material is completely chemically bonded to the sidewalls and the bottom of the trench to form the first monolayer;
partially removing the first monolayer along upper portions of the sidewalls of the trench by a chemical etching the first precursor material of the first monolayer; and
forming a second monolayer by flowing a second precursor material over a remaining portion of the first monolayer within the trench and reacting the second precursor material with the remaining first precursor material within the trench, wherein a portion of the second monolayer is formed by selectively reacting the second precursor material with the first precursor material that is on the bottom of the trench without reacting the second precursor material with the exposed upper portions of the sidewalls of the trench, and wherein the second material comprises the second monolayer; and
performing additional deposition cycles of sequentially flowing the first precursor material and the second precursor material until the second material reaches a predetermined height, wherein the second material is free of any voids encased therein;
removing the first substrate from the deposition chamber; and
after removing the first substrate from the deposition chamber, depositing a third material in an upper portion of the trench over the second material, wherein the third material is in direct physical contact with the second material, and wherein no etch back process is performed on the second material after removing the first substrate from the deposition chamber.

18. The method of claim 17, wherein the forming the first monolayer comprises forming a first film layer within the trench in a first self-limiting reaction.

19. The method of claim 18, wherein the partially removing the first monolayer comprises using a halide gas.

20. The method of claim 19, wherein the forming the second monolayer comprises a second self-limiting reaction.

* * * * *